(12) United States Patent
Katagiri

(10) Patent No.: US 9,411,080 B2
(45) Date of Patent: Aug. 9, 2016

(54) METHOD FOR MANUFACTURING CONDUCTIVE MEMBER, CONDUCTIVE MEMBER, AND TOUCH PANEL USING SAME

(71) Applicant: FUJIFILM Corporation, Minato-ku, Tokyo (JP)

(72) Inventor: Kensuke Katagiri, Ashigarakami (JP)

(73) Assignee: FUJIFILM Corporation, Tokyo (JP)

( * ) Notice: Subject to any disclaimer, the term of this patent is extended or adjusted under 35 U.S.C. 154(b) by 16 days.

(21) Appl. No.: 14/492,700

(22) Filed: Sep. 22, 2014

(65) Prior Publication Data

US 2015/0009432 A1   Jan. 8, 2015

Related U.S. Application Data

(63) Continuation of application No. PCT/JP2013/055334, filed on Feb. 28, 2013.

(30) Foreign Application Priority Data

Mar. 23, 2012 (JP) ................... 2012-066920
Jan. 30, 2013 (JP) ................... 2013-015147

(51) Int. Cl.
*G02B 5/02* (2006.01)
*G06F 3/041* (2006.01)
(Continued)

(52) U.S. Cl.
CPC ............ *G02B 5/0242* (2013.01); *G02B 5/0268* (2013.01); *G02F 1/13338* (2013.01);
(Continued)

(58) Field of Classification Search
CPC .............. H05K 1/0274; H05K 3/06; H05K 2203/0571; H05K 2201/0108; H05K 2201/09881; C23C 18/08; G02F 2001/133541; G02F 1/13439; G02F 1/133528; G02F 1/133504; G02F 1/13338; H01L 51/5268; H01L 51/5206; G06F 2203/04103; G06F 3/045; G06F 3/041; G02B 5/0268; G02B 5/0242

See application file for complete search history.

(56) References Cited

U.S. PATENT DOCUMENTS 6,723,392 B1 * 4/2004 Jinnai ................. G02B 5/0226
428/1.1
8,018,568 B2   9/2011 Allemand et al.
(Continued)

FOREIGN PATENT DOCUMENTS

JP   2008-290354 A   12/2008
JP   2010-140859 A    6/2010
(Continued)

OTHER PUBLICATIONS

International Search Report for PCT/JP2013/055334 dated May 21, 2013 [PCT/ISA/210], 5 pages.
Written Opinion for PCT/JP2013/055334 dated May 21, 2013 [PCT/ISA/237], 8 pages in Japanese and English.
Notice of Submission of Argument, mailed Feb. 29, 2016, issued in corresponding KR Application No. 10-2014-7026274, 13 pages in English and Korean.

*Primary Examiner* — Abbas Abdulselam
(74) *Attorney, Agent, or Firm* — Sughrue Mion, PLLC

(57) ABSTRACT

A method for manufacturing of a conductive member include
forming one of a conductive layer including metal nanowires or a light-scattering layer including insulating light-scattering fine particles on a substrate in a pattern shape; and
forming the other of the conductive layer including metal nanowires or the light-scattering layer including insulating light-scattering fine particles on a space of the substrate wherein the one of the conductive layer or the light-scattering layer is not formed.

22 Claims, 10 Drawing Sheets

(51) Int. Cl.
*G02F 1/1333* (2006.01)
*G02F 1/1335* (2006.01)
*G02F 1/1343* (2006.01)
*G06F 3/044* (2006.01)
*G06F 3/045* (2006.01)
*H01L 51/52* (2006.01)
*H05K 3/06* (2006.01)
*H05K 1/02* (2006.01)
*C23C 18/08* (2006.01)

(52) U.S. Cl.
CPC ...... *G02F1/13439* (2013.01); *G02F 1/133504* (2013.01); *G02F 1/133528* (2013.01); *G06F 3/041* (2013.01); *G06F 3/044* (2013.01); *G06F 3/045* (2013.01); *C23C 18/08* (2013.01); *G02F 2001/133541* (2013.01); *G06F 2203/04103* (2013.01); *H01L 51/5206* (2013.01); *H01L 51/5268* (2013.01); *H05K 1/0274* (2013.01); *H05K 3/06* (2013.01); *H05K 2201/0108* (2013.01); *H05K 2201/09881* (2013.01); *H05K 2203/0571* (2013.01)

(56) References Cited

U.S. PATENT DOCUMENTS

| | | | |
|---|---|---|---|
| 8,471,467 B2 * | 6/2013 | Boerner | .............. H01L 51/5237 |
| | | | 313/498 |
| 9,076,988 B2 * | 7/2015 | Pschenitzka | ........ H01L 31/0232 |
| 2007/0074316 A1 | 3/2007 | Alden et al. | |
| 2008/0292826 A1 | 11/2008 | Tanabe et al. | |
| 2011/0088770 A1 | 4/2011 | Allemand et al. | |
| 2011/0163403 A1 | 7/2011 | Bhatia et al. | |

FOREIGN PATENT DOCUMENTS

| | | |
|---|---|---|
| JP | 2010-157400 A | 7/2010 |
| JP | 2010-287540 A | 12/2010 |
| JP | 2012-28183 A | 2/2012 |
| JP | 2012-164519 A | 8/2012 |
| WO | 2012/005205 A1 | 1/2012 |

* cited by examiner

① FORMATION OF LAYER 1

② FORMATION OF ETCHING MASK

③ ETCHING

④ FORMATION OF LAYER 2

⑤ REMOVAL OF ETCHING MASK

① FORMATION OF LAYER 1

② (POSITIVE) EXPOSURE

③ DEVELOPMENT

④ FORMATION OF LAYER 2

⑤ (POSITIVE) EXPOSURE

⑥ DEVELOPMENT

① FORMATION OF LAYER 1

SUBSTRATE   LAYER 1

② (NEGATIVE) EXPOSURE

SUBSTRATE   LAYER 1

③ DEVELOPMENT

LAYER 1   SUBSTRATE

④ FORMATION OF LAYER 2

LAYER 2
LAYER 1 SUBSTRATE

⑤ (NEGATIVE) EXPOSURE

LAYER 1 / SUBSTRATE
    LAYER 2

⑥ DEVELOPMENT

LAYER 1   SUBSTRATE
    LAYER 2

① FORMATION OF LAYER 1

SUBSTRATE    LAYER 1

② (NEGATIVE) EXPOSURE

SUBSTRATE   LAYER 1

③ DEVELOPMENT

LAYER 1   SUBSTRATE

④ FORMATION OF LAYER 2
LAYER 2

LAYER 1 SUBSTRATE

⑤ (POSITIVE) EXPOSURE

LAYER 1 / SUBSTRATE
    LAYER 2

⑥ DEVELOPMENT

LAYER 1   SUBSTRATE
    LAYER 2

① PRINTING OF LAYER 1 PATTERN

② FORMATION OF MASK

③ FORMATION OF LAYER 2

④ REMOVAL OF MASK

① PRINTING OF LAYER 1 PATTERN

② PRINTING OF LAYER 2 PATTERN

① PRINTING OF LAYER 1 PATTERN

② FORMATION OF LAYER 2

③ (NEGATIVE) EXPOSURE

④ DEVELOPMENT

① PRINTING OF LAYER 1 PATTERN

② FORMATION OF LAYER 2

③ (POSITIVE) EXPOSURE

④ DEVELOPMENT

METHOD FOR MANUFACTURING CONDUCTIVE MEMBER, CONDUCTIVE MEMBER, AND TOUCH PANEL USING SAME

CROSS-REFERENCE TO RELATED APPLICATIONS

This application is a Continuation of PCT International Application No. PCT/JP2013/055334 filed on Feb. 28, 2013, which claims priority under 35 U.S.C §119(a) to Japanese Patent Application No. 2013-015147 filed on Jan. 30, 2013 and Japanese Patent Application No. 2012-066920 filed on Mar. 23, 2012. Each of the above application(s) is hereby expressly incorporated by reference, in its entirety, into the present application.

BACKGROUND OF THE INVENTION

1. Field of the Invention

The present invention relates to a method for manufacturing a conductive member, a conductive member, and a touch panel using the same.

2. Description of the Related Art

While ITO is widely used as a conductive material for an electrode which is used for a display apparatus such as a touch panel-equipped liquid crystal display or an organic EL display (for example, a handheld terminal and a mobile phone), an integrated solar cell, and the like, there are problems of a small reserve of indium metal, the color tone caused by a low permeability in a long wavelength range, a necessity of a high-temperature thermal treatment for decreasing resistance, low bending resistance, and the like, and therefore a variety of studies are being conducted regarding alternative materials to ITO.

As one of the alternative materials, a conductive material for which conductive metal nanowires are used has been proposed (for example, US2007/0074316A), and expectation is increasing as an alternative material to ITO glass or TIO films since the metal nanowires are excellent in terms of transparency, low resistance, and the reduction of the amount of metal used.

However, due to the wire structure, the metal nanowires have problems of a high haze value and weak durability under high humidity and temperature conditions.

In addition, particularly, in an apparatus requiring a patterning electrode such as a display apparatus like a liquid crystal display, an organic EL display, or a touch panel, when a transparent electrode is patterned, there are problems in that the difference in the haze value between sections including the metal nanowires (conductive regions) and sections including no metal nanowires (non-conductive regions) is great, and the electrode pattern becomes easily visible.

Therefore, for example, U.S. Pat. No. 8,018,568A proposes a method for decreasing the difference in haze between conductive sections and non-conductive sections by partially cutting the metal nanowires and leaving the metal nanowires or metal nanorods of metal nanowire fragments in the non-conductive sections. In addition, for example, JP2010-157400A proposes a method for decreasing the haze difference between the conductive sections and the non-conductive sections by forming fine pinholes to be as small as being seemingly invisible in a conductive nanofiber layer using a method for forming a pattern through energy ray radiation or etching resist so as to form the non-conductive sections. Furthermore, for example, JP2010-287540A discloses a method for insulating a conductive nanofiber by forcibly oxidizing the conductive nanofiber using a plasma treatment or a corona treatment. As described above, techniques for making the pattern invisible or stealthy are actively developed to solve the problem of the appearance of the pattern.

SUMMARY OF THE INVENTION

The method of JP2010-157400A in which an energy ray is used is difficult to be put into practical use since the costs for a facility and energy for the pattern radiation of an energy ray are high. Furthermore, JP2010-287540A is intended to supply environment resistance such as oxidizing resistance or sulfurizing resistance and thermal resistance, and there was a problem in that the method is not applicable to a conductive film obtained by applying a corrosion inhibitor to a conductive fiber or to a conductive film formed so that only a part of a conductive fiber is exposed on the film surface, and the majority is implanted in the film. As a result of intensive studies regarding the techniques described in the above-described documents, the present inventors found that, compared with a case in which conductive particles are fully removed, the above-described techniques are likely to cause insulation failure from electrochemical migration (hereinafter, also referred to simply as migration). However, when conductive particles are fully removed, the problem of haze still remains.

The invention has been made in consideration of the above-described problems of the related art, and provides a conductive member that has favorable conductive properties and high transparency, and does not easily allow the appearance of a pattern and insulation failure caused by electrochemical migration, a method for manufacturing the same, and a touch panel and a display apparatus in which the conductive member is used.

As a result of intensive studies based on the above-described object, the inventors found that it is preferable to form a light-scattering layer provided with insulating light-scattering fine particles (hereinafter also referred to as "non-conductive light-scattering fine particles" or simply "light-scattering fine particles") in non-conductive regions to decrease the haze difference between conductive regions including metal nanowires and the non-conductive regions including no metal nanowires. In addition, the inventors unexpectedly found that the above-described configuration suppresses the occurrence of migration, and completed the invention.

A method for manufacturing a conductive member of the invention capable of solving the above-described problems, includes forming a conductive layer including metal nanowires on a substrate in a pattern shape, and then forming a light-scattering layer including insulating light-scattering fine particles on a space of the substrate wherein the conductive layer is not formed; or forming a light-scattering layer including insulating light-scattering fine particles on a substrate in a pattern shape, and then forming a conductive layer including metal nanowires on a space of the substrate wherein the light-scattering layer is not formed.

A ratio of haze between the conductive layer and the light-scattering layer calculated by dividing a haze of the light-scattering layer by a haze of the conductive layer (a haze of the light-scattering layer/a haze of the conductive layer) is preferably in a range of 0.7 to 1.3.

In addition, the conductive layer and the light-scattering layer preferably include a matrix obtained by hydrolyzing and polycondensing a compound represented by the following general formula (II),

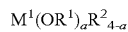

(II)

(in the general formula (II), $M^1$ represents an element selected from Si, Ti, and Zr, each of $R^1$ and $R^2$ individually represents a hydrogen atom or a hydrocarbon group, and a represents an integer of 2 to 4).

In addition, an average short axis length of the metal nanowires is preferably 150 nm or less.

In addition, an average long axis length of the metal nanowires is preferably in a range of 1 µm to 40 µm.

In addition, a content of the metal nanowires configuring the conductive layer is preferably in a range of 1.0 mg/m² to 150.0 mg/m² in the conductive layer.

In addition, the metal nanowires preferably contain silver.

In addition, a difference in thickness between the conductive layer and the light-scattering layer is preferably 500% or less of a thickness of the thinner layer of the conductive layer or the light-scattering layer.

In addition, preferably, forming the conductive layer including metal nanowires on the substrate in the pattern shape or forming the light-scattering layer including insulating light-scattering fine particles on the substrate in the pattern shape is respectively achieved by applying an etching mask in the pattern shape onto the conductive layer or the light-scattering layer, and applying a liquid capable of dissolving the conductive layer or the light-scattering layer to an opening of the etching mask.

In addition, preferably, forming the conductive layer including metal nanowires on the substrate in the pattern shape or forming the light-scattering layer including insulating light-scattering fine particles on the substrate in the patter shape is respectively achieved by printing a photoresist in the pattern shape on the conductive layer or the light-scattering layer, and applying a liquid capable of dissolving the conductive layer or the light-scattering layer to an opening of the photoresist.

In addition, preferably, forming the light-scattering or the conductive layer in the opening of the etching mask after applying the liquid capable of dissolving the conductive layer or the light-scattering layer, and peeling the etching mask off are further included.

In addition, preferably, forming the conductive layer including metal nanowires on the substrate in the pattern shape or forming the light-scattering layer including insulating light-scattering fine particles on the substrate in the pattern shape is respectively achieved by printing the conductive layer or the light-scattering layer in the pattern shape.

In addition, preferably, forming the conductive layer including metal nanowires on the substrate in the pattern shape or forming the light-scattering layer including insulating light-scattering fine particles on the substrate in the pattern shape is respectively achieved by pattern-exposing and developing the conductive layer or the light-scattering layer.

In addition, preferably, forming the conductive layer including the metal nanowires on the substrate in the pattern shape, and then forming the light-scattering layer including the light-scattering fine particles on the space of the substrate wherein the conductive layer is not formed.

In addition, preferably, forming the light-scattering layer including the light-scattering fine particles on the substrate in the pattern shape, and then forming the conductive layer including the metal nanowires on the space of the substrate wherein the light-scattering layer is not formed.

A conductive member of the invention includes a substrate; a conductive layer including metal nanowires; and a light-scattering layer including at least insulating light-scattering fine particles, in which the number of the metal nanowires per unit area of the light-scattering layer is 5% or less with respect to the number of the metal nanowires per unit area of the conductive layer, and the number of the light-scattering fine particles per unit area of the conductive layer is 5% or less with respect to the number of the light-scattering fine particles per unit area of the light-scattering layer.

A ratio of haze between the conductive layer and the light-scattering layer calculated by dividing a haze of the light-scattering layer by a haze of the conductive layer (a haze of the light-scattering layer/a haze of the conductive layer) is preferably 0.7 to 1.3.

A polarizing plate of the invention includes the conductive member of the invention.

A circularly polarizing plate of the invention includes the conductive member of the invention.

A display apparatus of the invention includes the conductive member of the invention.

A display apparatus of the invention includes the polarizing plate of the invention.

A display apparatus of the invention includes the circularly polarizing plate of the invention.

A touch panel of the invention includes the conductive member of the invention.

According to the invention, it is possible to provide a conductive member that has favorable conductive properties and high transparency, and does not easily allow the appearance of a pattern and insulation failure caused by electrochemical migration, a method for manufacturing the same, and a touch panel and a display apparatus in which the conductive member is used.

DESCRIPTION OF THE PREFERRED EMBODIMENTS

Hereinafter, the invention will be described based on a typical embodiment of the invention, but the invention is not limited to the described embodiment within the scope of the purpose of the invention.

Meanwhile, in the present specification, numeric ranges expressed using "to" indicate that the ranges include numeric values described before and after "to" as the lower limit value and the upper limit value.

In the specification, a terminology of "light" is used as a concept including not only visible light rays but also high-energy rays such as ultraviolet rays, X-rays, and gamma rays, and particle rays such as electron beams.

In the specification, there are cases in which "(meth)acrylic acid" and "(meth)acrylate" are used respectively to indicate either or both of acrylic acid and methacrylic acid and to indicate either or both of acrylate and methacrylate.

In addition, contents will be expressed in terms of mass equivalent unless particularly otherwise described, mass % will indicate the proportion in the total amount of a composition unless particularly otherwise described, and a "solid content" refers to components in a composition excluding a solvent.

Figure 1:
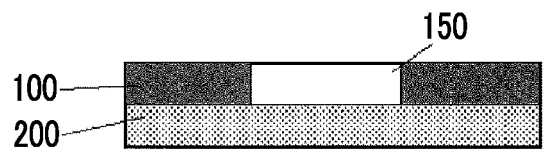
FIG. 1 is a schematic view illustrating an example of a conductive member of the invention.

FIG. 1 illustrates a schematic view of an example of a conductive member of the invention. The conductive member includes a substrate 200, a conductive layer 100 including metal nanowires, and a light-scattering layer 150 including at least non-conductive light-scattering fine particles, the number of the metal nanowires in the light-scattering layer 150 is 5% or less with respect to the number of the metal nanowires per unit area of the conductive layer 100, and the number of the light-scattering fine particles per unit area of the conductive layer 100 is 5% or less with respect to the number of the light-scattering fine particles per unit area of the light-scattering layer 150.

In the invention, the light-scattering layer 150 includes light-scattering fine particles. It is considered that, when the light-scattering fine particles are included in the light-scattering layer 150, the light-scattering fine particles scatter light to the same extent as the metal nanowires in the conductive layer, and therefore the difference in haze between the conductive layer 100 and the light-scattering layer 150 becomes small (the ratio of haze approximates to one).

The conductive layer and the light-scattering layer are formed on the substrate. The conductive layer is formed by forming a conductive region including the metal nanowires and patterning parts of the conductive region, or by directly printing a pattern using a variety of printing methods. The light-scattering layer is formed in parts on a space of the substrate which the conductive layer is not formed (non-conductive regions). Here, the order of forming the conductive layer and the light-scattering layer is not particularly limited. For example, the light-scattering layer may be formed by forming a non-conductive region including the light-scattering fine particles and patterning parts of the non-conductive region, or by directly printing a pattern using a variety of printing methods, and the conductive layer may be formed in parts from which the light-scattering layer has been removed through the patterning (the non-conductive regions).

Hereinafter, a variety of members, manufacturing methods, and the like used in the invention will be described in detail.

Conductive Layer:

The conductive layer according to the invention is formed on the substrate, and is made up of the metal nanowires and a matrix.

(Metal Nanowires)

In the specification, the metal nanowires refer to conductive nanowires having a long shape in which the length in the long axis direction is five times or more the diameter (the length in the short axis direction) (the aspect ratio is 5 or more). The metal nanowires may be solid fibers or hollow fibers.

The material for the metal nanowires is not particularly limited, and can be appropriately selected depending on purposes. For example, the material for the metal nanowires is preferably at least one metal selected from the group consisting of Periods 4, 5, and 6, more preferably at least one metal selected from the group consisting of Groups 2 to 14, and still more preferably at least one metal selected from the group consisting of Groups 2, 8, 9, 10, 11, 12, 13, and 14 in a large version of the periodic table (IUPAC1991), and the metal is particularly preferably contained as a principal component.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, alloys thereof, and the like. Among the above-described metals, silver and alloys with silver are particularly preferred in terms of excellent conductive properties.

Examples of a metal used in the alloy with silver include platinum, osmium, palladium, iridium, tin, bismuth, nickel, and the like. The above-described metals may be solely used, or two or more metals may be jointly used.

The shape of the metal nanowire is not particularly limited, and can be appropriately selected depending on purposes. For example, the shape can be an arbitrary shape such as a cylindrical shape, a cuboidal shape, or a columnar shape having a polyhedral cross-section, but a cylindrical shape or a shape having a polyhedral cross-section with round corners is preferred for use requiring high transparency.

Here, the cross-sectional shape of the metal nanowire can be investigated by applying a metal nanowire aqueous dispersion liquid on a base material, and observing cross-sectional slices produced using a microtome using a transmission electron microscope (TEM).

The average short axis length of the metal nanowires (in some cases, called "average short axis length" or "average diameter") is preferably 150 nm or less, more preferably in a range of 5 nm to 100 nm, and particularly preferably in a range of 10 nm to 30 nm.

The average short axis length of the metal nanowires was obtained from the average value after observing 300 metal nanowires using a transmission electron microscope (TEM; manufactured by JEOL Ltd., JEM-2000FX). Meanwhile, in a case in which the short axis of the metal nanowire is not circular, the longest diameter was considered as the short axis length.

The average long axis length of the metal nanowires (in some cases, called "average length") is preferably 1 μm or more, more preferably in a range of 5 μm to 40 μm, and still more preferably in a range of 5 μm to 30 μm.

When the average long axis length is less than 1 μm, it is difficult to form a dense network, and there is a case in which sufficient conductive properties cannot be obtained. When the average long axis length exceeds 40 μm, the metal nanowires are too long, and thus there is a case in which the metal nanowires entangle during manufacturing, or generate aggregates in a manufacturing process.

The average long axis length of the metal nanowires was obtained from the average value after observing 300 metal nanowires using, for example, a transmission electron microscope (TEM; manufactured by JEOL Ltd., JEM-2000FX). Meanwhile, in a case in which the metal nanowires were bent, the long axis length of each of the metal nanowires was obtained by tracing the curve of a metal nanowire image through image analysis, and measuring the trajectory length.

The variation coefficient of the short axis length of the metal nanowire is preferably in a range of 0% to 50%, more preferably in a range of 0% to 40%, and particularly preferably in a range of 0% to 30%.

The variation coefficient was obtained by measuring the short axis lengths (diameters) of 300 metal nanowires randomly selected from the above-described electron microscope (TEM) image, and calculating the standard deviation and average value of the 300 metal nanowires.

The metal nanowires are not particularly limited, and may be produced using any method. But the metal nanowires are preferably manufactured as described below by reducing metal ions in a solvent containing a halogen compound and a dispersant dissolved therein. In addition, it is preferable to carry out a desalination treatment using an ordinary method after the metal nanowires are formed from the viewpoint of dispersibility and the stability of the conductive layer over time.

In addition, as a method for manufacturing the metal nanowires, it is possible to use the methods described in JP2009-215594A, JP2009-242880A, JP2009-299162A, JP2010-84173A, JP2010-86714A, and the like.

A solvent used for the manufacturing of the metal nanowires is preferably a hydrophilic solvent, and examples thereof include water, alcohols, polyvalent alcohols, ethers, ketones, and the like. The above-described solvents may be solely used, or two or more solvents may be jointly used.

Examples of the alcohols include methanol, ethanol, normal propanol, isopropanol, butanol, and the like. Examples of the polyvalent alcohols include ethylene glycol, 1,2-propylene glycol, 1,3-propylene glycol, and the like. Examples of the ethers include dioxane, tetrahydrofuran, and the like. Examples of the ketons include acetone, methyl ethyl ketone, and the like. In a case in which the components are heated, the heating temperature is preferably 250° C. or lower, more preferably in a range of 20° C. to 200° C., still more preferably in a range of 30° C. to 180° C., particularly more preferably in a range of 40° C. to 170° C., and most preferably in a range of 50° C. to 100° C. as long as the heating temperature does not exceed the boiling point of a solvent being used. Meanwhile, the above-described boiling point refers to a temperature at which the vapor pressure of the reaction solvent becomes equal to the pressure in the reaction container. The heating temperature is preferably set to 20° C. or higher since the formation of the metal nanowires is accelerated, and it is possible to shorten the process time taken for manufacturing. In addition, the heating temperature is preferably set to 250° C. or lower from the viewpoint of transparency and conductive properties since the monodispersibility of the short axis length and long axis length of the metal nanowires improves. Meanwhile, if necessary, the temperature may be changed in a particle-forming step, and the temperature change in the middle may bring about an effect that improves the monodispersibility through the control of nuclear formation, the suppression of the regeneration of nuclei, and the acceleration of selective growth.

When the solvent used for the manufacturing of the metal nanowires is heated, it is preferable to add a reducing agent.

The reducing agent is not particularly limited, and can be appropriately selected from ordinarily used reducing agents. Examples thereof include boron hydride metal salts, aluminum hydride salts, alkanolamines, aliphatic amines, heterocyclic amines, aromatic amines, aralkylamines, alcohols, polyvalent alcohols, organic acids, reducing sugars, sugar alcohols, sodium sulfite, hydrazine compounds, dextrins, hydroquinone, hydroxylamines, glutathione, and the like.

Among the above-described reducing agents, reducing sugars, sugar alcohols as derivatives of reducing agents, and polyvalent alcohols are particularly preferred. Among the above-described reducing agents, there are compounds also functioning as a dispersant or a solvent, and such compounds can be preferably used in the same manner.

During the manufacturing of the metal nanowires, it is preferable to add a dispersant and a halogen compound or fine halogenated metal particles.

The dispersant may be added before, at the same time as, or after the addition of the reducing agent, and may be added before, at the same time as, or after the addition of metal ions or the fine halogenated metal particles.

The dispersant may be added before the preparation of particles, may be added in the presence of a dispersion polymer, or may be added to control the dispersion state after the preparation of particles. When the dispersant is added in two or more separated steps, the amount needs to be changed depending on the necessary lengths of the short axis and long axis of the metal wires. This is considered to be because the amount and size of metal particles serving as nuclei for the metal nanowires are affected by the amount of the dispersant, and the lengths of the short axis and long axis of the metal wires are affected by the amount and size of metal particles serving as nuclei for the metal nanowires.

Examples of the dispersant include amino group-containing compounds, thiol group-containing compounds, sulfide group-containing compounds, amino acids or derivatives thereof, peptide compounds, polysaccharides, polymers such as polysaccharide-derived natural polymers, synthetic polymers, gels derived from polysaccharide-derived natural polymers or synthetic polymers, and the like. Among the above-described dispersants, a variety of polymer compounds used as the dispersant are compounds included in the below-described polymers.

Preferable examples of a polymer that is preferably used as the dispersant include polymers having a hydrophilic group such as gelatin that is a polymer serving as a protective colloid, polyvinyl alcohols, methyl cellulose, hydroxypropyl cellulose, polyalkylene amine, partial alkyl esters of a polyacrylic acid, polyvinylpyrrolidone, copolymers having a polyvinylpyrrolidone structure, and polyacrylic acids having an amino group or a thiol group.

The weight-average molecular weight (Mw) of the polymer used as the dispersant measured using a GPC method is preferably in a range of 3000 to 300000, and more preferably in a range of 5000 to 100000.

Regarding the structure of a compound that can be used as the dispersant, for example, "Pigment Dictionaries" (edited by Seishiro ITO, published by Asakura Publishing Co., Ltd., 2000) can be referenced.

It is possible to change the shape of the metal nanowire to be obtained depending on the type of the dispersant being used.

The halogen compound is not particularly limited as long as the halogen compound is a compound containing bromine, chlorine, and iodine, and can be appropriately selected depending on purposes. Examples thereof include alkali halides such as sodium bromide, sodium chloride, sodium iodide, potassium bromide, potassium chloride, and potassium iodide.

In addition, the following halogen compounds functioning as the dispersant can also be preferably used in the same manner.

Fine halogenated silver particles may be used as an alternative to the halogenated compound, and the halogen compound and fine halogenated silver particles may be jointly used.

In addition, instead of the dispersant and the halogen compound, a single substance having both functions may be used. That is, when a halogen compound having a dispersant function is used, both functions of the dispersant and the halogen compound are developed using a single compound.

Examples of the halogen compound having a dispersant function include hexadecyl trimethyl ammonium bromide, hexadecyl trimethyl ammonium chloride, hexadecyl trimethyl ammonium iodide, dodecyl trimethyl ammonium bromide, dodecyl trimethyl ammonium chloride, dodecyl trimethyl ammonium iodide, stearyl trimethyl ammonium bromide, stearyl trimethyl ammonium chloride, stearyl trimethyl ammonium iodide, decyl trimethyl ammonium bromide, decyl trimethyl ammonium chloride, decyl trimethyl ammonium iodide, dimethyl distearyl ammonium bromide, dimethyl distearyl ammonium chloride, dimethyl distearyl ammonium iodide, dilauryl dimethyl ammonium bromide, dilauryl dimethyl ammonium chloride, dilauryl dimethyl ammonium iodide, dimethyl dipalmityl ammonium bromide, dimethyl dipalmityl ammonium chloride, dimethyl dipalmityl ammonium iodide, tetramethyl ammonium bromide, tetramethyl ammonium chloride, tetramethyl ammonium iodide, tetraethyl ammonium bromide, tetraethyl ammonium chloride, tetraethyl ammonium iodide, tetrapropyl ammonium bromide, tetrapropyl ammonium chloride, tetrapropyl ammonium iodide, tetrabutyl ammonium bromide, tetrabutyl ammonium chloride, tetrabutyl ammonium iodide, methyl triethyl ammonium chloride, methyl triethyl ammoniumbromide, methyl triethyl ammonium iodide, dimethyl diethyl ammonium bromide, dimethyl diethyl ammonium chloride, dimethyl diethyl ammonium iodide, ethyl triethyl ammonium bromide, ethyl triethyl ammonium chloride, ethyl triethyl ammonium iodide, hexadecyl dimethyl ammonium bromide, hexadecyl dimethyl ammonium chloride, hexadecyl dimethyl ammonium iodide, dodecyl dimethyl ammonium bromide, dodecyl dimethyl ammonium chloride, dodecyl dimethyl ammonium iodide, stearyl dimethyl ammonium bromide, stearyl dimethyl ammonium chloride, stearyl dimethyl ammonium iodide, decyl dimethyl ammonium bromide, decyl dimethyl ammonium chloride, decyl dimethyl ammonium iodide, and the like all of which include an amino group, a bromide ion, a chloride ion, or an iodine ion. The above-described halogen compounds may be solely used, or two or more halogen compounds may be jointly used.

The desalination treatment method for removing unnecessary components other than the metal nanowires such as organic substances and inorganic ions is not particularly limited, and it is possible to use sedimentation of the metal nanowires by centrifugal separation or the like and the subsequent removal of supernatants, removal of filtrates by ultrafiltration, additionally, dialysis, gel filtration, and the like. In addition, to remove unnecessary components, it is also possible to carry out the desalination treatment by appropriately adding a chemical that accelerates the elution of the unnecessary components. Examples of the above-described chemical that accelerates the elution of the unnecessary components include ammonia against silver halide such as silver chloride, chelating agents against a variety of metal ions, calcium disodium ethylenediaminetetraacetate, and the like.

The metal nanowires preferably include inorganic ions such as alkali metal ions, alkali earth metal ions, and halide ions as little as possible. When the metal nanowires are made into an aqueous dispersed substance, the electric conductivity is preferably 1 mS/cm or less, more preferably 0.1 mS/cm or less, and still more preferably 0.05 mS/cm or less.

When the metal nanowires are made into an aqueous dispersed substance, the viscosity at 20° C. is preferably in a range of 0.5 mPa·s to 100 mPa·s, and more preferably in a range of 1 mPa·s to 50 mPa·s.

The aspect ratio of the metal nanowires in the invention is not particularly limited as long as the aspect ratio is 10 or more, and can be appropriately selected depending on purposes. The aspect ratio is more preferably 50 or more, still more preferably 100 or more, still more preferably 5000 or more, and more preferably in a range of 10,000 to 100,000. The aspect ratio, generally, means the ratio between the long side and short side of a fibrous substance (the ratio of the average long axis length/the average short axis length).

The method for measuring the aspect ratio is not particularly limited, and can be appropriately selected depending on purposes. For example, the aspect ratio can be measured using an electron microscope or the like.

In a case in which the aspect ratio of the metal nanowires is measured using an electron microscope, it is preferable that whether or not the aspect ratio of the metal nanowires is 10 or more can be checked in a single view of an electron microscope. In addition, it is also possible to estimate the aspect ratio of the entirety of the metal nanowires by separately measuring the average long axis length and average short axis length of the metal nanowires.

In a case in which the metal nanowires have a tubular shape (hollow fibers), the outer diameter of the tube is used as the diameter for the computation of the aspect ratio.

Here, the average short axis length and average long axis length of the metal nanowires can be obtained by observing a TEM image or an optical microscope image using a transmission electron microscope (TEM) or an optical microscope, and in the invention, the average short axis length and average long axis length of the metal nanowires were obtained from the average values after observing 300 metal nanowires using a transmission electron microscope (TEM).

The content of the metal nanowires in the conductive layer is preferably in a range of 1.0 mg/m$^2$ to 150.0 mg/m$^2$, more preferably in a range of 5.0 mg/m$^2$ to 50 mg/m$^2$, and particularly preferably in a range of 5.0 mg/m$^2$ to 25 mg/m$^2$.

In addition, the conductive layer may be a pattern conductive layer, and in the present aspect, a conductive layer-forming composition is preferably a photosensitive composition. The photosensitive composition may be a negative-type composition or a positive-type composition. Hereinafter, examples of the photosensitive composition that can be used for the formation of the conductive layer will be described, but the photosensitive composition is not limited to the following examples.

For the formation of the conductive layer, together with the metal nanowires, it is possible to use, for example, (1) a photosensitive composition containing at least a binder and a photopolymerizable composition or (2) a composition containing at least a sol-gel cured substance as the matrix.

Here, the "matrix" is a collective term for substances forming a layer by including the metal nanowires or the light-scattering fine particles. When the matrix is included, the dispersion of the metal nanowires in the conductive layer or the dispersion of the light-scattering fine particles in the light-scattering layer is stably maintained, and therefore the strong adhesion between the base material and the conductive layer or the light-scattering layer is ensured even in a case in which the conductive layer or the light-scattering layer is formed on the base material surface without interposing an adhesion layer. Any matrix can be used for the conductive layer or the light-scattering layer of the invention with no particular limitation, but it is particularly preferable to use a sol-gel cured substance obtained by hydrolyzing or polycondensing the below-described specific alkoxide compound as the matrix due to excellent abrasion resistance, thermal resistance, and moist heat resistance.

Binder:

A binder can be appropriately selected from alkali-soluble resins that are linear organic high-molecular-weight polymers, and have at least one group accelerating dissolution in an alkali (for example, carboxylic group, phosphate group, sulfonic acid group, or the like) in the molecule (preferably, the molecule including an acryl-based copolymer or a styrene-based copolymer as a main chain).

Among the above-described alkali-soluble resins, an alkali-soluble resin that is soluble in an organic solvent and is soluble in an alkali aqueous solution is preferred, and an alkali-soluble resin that has an acid-dissociable group, and becomes alkali-soluble when the acid-dissociable group is dissociated by the action of an acid is particularly preferred.

Here, the acid-dissociable group refers to a functional group capable of being dissociated in the presence of an acid.

For the manufacturing of the binder, for example, a method in which a well-known radical polymerization method is used can be applied. When the alkali-soluble resin is manufactured using the radical polymerization method, a variety of polymerization conditions such as temperature, pressure, the type and amount of a radical initiator, and the type of a solvent can be easily set by a person skilled in the art, and it is possible to specify the conditions experimentally.

The linear organic high-molecular-weight polymer is preferably a polymer having carboxylic acid in a side chain.

Examples of the polymer having carboxylic acid in a side chain include methacrylic acid copolymers, acrylic acid copolymers, itaconic acid copolymers, crotonic acid copolymers, maleic acid copolymers, partially-esterified maleic acid copolymers which are described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), and JP1984-71048A (JP-S59-71048A), acidic cellulose derivatives having carboxylic acid in a side chain, polymers obtained by adding an acid anhydride to a polymer having a hydroxyl group, and the like, and furthermore, high-molecular-weight polymers having a (meth)acryloyl group in a side chain also can be preferable examples.

Among the above-described polymers, benzyl(meth)acrylate/(meth)acrylic acid copolymers and multicomponent copolymers made up of benzyl(meth)acrylate/(meth)acrylic acid/other monomer are particularly preferred.

Furthermore, high-molecular-weight polymers having a (meth)acryloyl group in a side chain and multicomponent copolymers made up of (meth)acrylic acid/glycidyl(meth)acrylate/other monomer also can be useful examples. The above-described polymers can be mixed in an arbitrary amount.

In addition to the above-described polymers, examples thereof include 2-hydroxypropyl(meth)acrylate/polystyrene macromonomer/benzyl methacrylate/methacrylic acid copolymers, 2-hydroxy-3-phenoxypropyl acrylate/polymethyl methacrylate macromonomer/benzyl methacrylate/methacrylic copolymers, 2-hydroxyethyl methacrylate/polystyrene macromonomer/methyl methacrylate/methacrylic acid copolymers, 2-hydroxyethyl methacrylate/polystyrene macromonomer/benzyl methacrylate/methacrylic acid copolymers, and the like which are described in JP1995-140654A (JP-H7-140654A).

The specific constituent unit in the alkali-soluble resin is preferably (meth)acrylic acid and other monomers capable of copolymerizing with the (meth)acrylic acid.

Examples of the other monomers capable of copolymerizing with the (meth)acrylic acid include alkyl(meth)acrylate, aryl(meth)acrylate, vinyl compounds, and the like. In the above-described monomers, the hydrogen atom in the alkyl group or the aryl group may be substituted by a substituent.

Examples of the alkyl(meth)acrylate or the aryl(meth)acrylate include methyl(meth)acrylate, ethyl(meth)acrylate, propyl(meth)acrylate, butyl(meth)acrylate, isobutyl(meth)acrylate, pentyl(meth)acrylate, hexyl(meth)acrylate, octyl(meth)acrylate, phenyl(meth)acrylate, benzyl(meth)acrylate, tolyl(meth)acrylate, naphthyl(meth)acrylate, cyclohexyl(meth)acrylate, dicyclopentanyl(meth)acrylate, dicyclopentenyl(meth)acrylate, dicyclopentenyloxy ethyl(meth)acrylate, glycidyl methacrylate, tetrahydrofurfuryl methacrylate, polymethyl methacrylate macromonomers, and the like. The above-described (meth)acrylates may be solely used, or two or more (meth)acrylates may be jointly used.

Examples of the vinyl compounds include styrene, α-methylstyrene, vinyltoluene, acrylonitrile, vinyl acetate, N-vinylpyrrolidone, polystyrene macromonomer, $CH_2=CR^1R^2$ [wherein $R^1$ represents a hydrogen atom or an alkyl group having 1 to 5 carbon atoms; and $R^2$ represents an aromatic hydrocarbon ring having 6 to 10 carbon atoms], and the like. The above-described vinyl compounds may be solely used or two or more vinyl compounds may be jointly used.

The weight-average molecular weight of the binder is preferably in a range of 1,000 to 500,000, more preferably in a range of 3,000 to 300,000, and still more preferably in a range of 5,000 to 200,000 in terms of the alkali dissolution rate, film properties, and the like.

Here, the weight-average molecular weight can be obtained through measurement using gel permeation chromatography and the use of the standard polystyrene calibration curve.

The content of the binder is preferably in a range of 5 mass % to 90 mass %, more preferably in a range of 10 mass % to 85 mass %, and still more preferably in a range of 20 mass % to 80 mass % on the basis of the total mass of the solid content of the photopolymerizable composition (photosensitive composition) including the above-described metal nanowires. When the content is within the above-described preferable range, it is possible to satisfy both developing properties and the conductive properties of the metal nanowires.

(Photopolymerizable Composition (Photosensitive Composition))

The photopolymerizable composition refers to a compound that supplies a function of forming an image through exposure to the conductive layer or triggers the supply of the above-described function. The photopolymerizable composition includes (a) an addition-polymerizable unsaturated compound and (b) a photopolymerization initiator generating a radical when irradiated with light as basic components.

[(a) The Addition-Polymerizable Unsaturated Compound]

The addition-polymerizable unsaturated compound (hereinafter also called "polymerizable compound") of the component (a) is a compound that is polymerized by causing an addition-polymerization reaction in the presence of a radical, and generally, a compound having at least one, more preferably two or more, still more preferably four or more, and further more preferably six or more ethylenic unsaturated double bonds in the molecular end is used.

The addition-polymerizable unsaturated compound has chemical forms of, for example, a monomer, a prepolymer, that is, a dimer, a trimer, an oligomer, a mixture thereof, and the like.

A variety of well-known compounds are known as the above-described polymerizable compound, and the compounds can be used as the component (a).

Among the above-described compounds, trimethylol propane tri(meth)acrylate, pentaerythritol tetra(meth)acrylate, dipentaerythritol hexa(meth)acrylate, dipentaerythritol penta (meth)acrylate are particularly preferred polymerizable compounds from the viewpoint of the film strength.

The content of the component (a) is preferably in a range of 2.6 mass % to 37.5 mass %, and more preferably in a range of 5.0 mass % to 20.0 mass % on the basis of the total mass of the solid content of the photopolymerizable composition including the above-described metal nanowires.

[(b) The Photopolymerization Initiator]

The photopolymerization initiator of the component (b) is a compound that generates a radical when irradiated with light. Examples of the above-described photopolymerizable initiator include compounds generating an acid radical which ultimately turns into an acid by light irradiation and compounds generating other radicals. Hereinafter, the former compounds will be called "photo-acid-generating agents", and the latter compounds will be called "photo-radical-generating agents".

—Photo-Acid-Generating Agent—

As the photo-acid-generating agent, it is possible to appropriately select and use a substance from photo initiators of photo cationic polymerization, photo initiators of photo radical polymerization, photo decoloring agents of pigments, photo discoloring agents, well-known compounds generating an acid radical by the radiation of an active light ray or a radiant ray which is used for micro resist and the like, and mixtures thereof.

The above-described photo-acid-generating agent is not particularly limited, and can be appropriately selected depending on purposes. Examples thereof include quinone diazide compounds, triazine-based compounds having at least one di- or tri-halomethyl group, 1,3,4-oxadiazole, naphthoquinone-1,2-diazide-4-sulfonyl halide, diazonium salts, phosphonium salts, sulfonium salts, iodonium salts, imide sulfonate, oxime sulfonate, diazodisulfone, disulfone, o-nitrobenzyl sulfonate, and the like. Among the above-described photo-acid-generating agents, imide sulfonate, oxime sulfonate, and o-nitrobenzyl sulfonate which are compounds generating sulfonic acid are particularly preferred.

In addition, it is possible to use compounds obtained by introducing a group or a compound that generates an acid radical by the radiation of an active light ray or a radiant ray into the main chain or side chain of a resin, for example, the compounds described in U.S. Pat. No. 3,849,137A, German Patent No. 3914407, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), and JP1988-146029A (JP-S63-146029A).

Furthermore, it is also possible to use the compounds described in specifications of U.S. Pat. No. 3,779,778A, EP126,712B, and the like as the acid-radical-generating agent.

As the triazine-based compound, it is possible to use the compounds described in, for example, JP2011-018636A and JP2011-254046A.

In the invention, among the photo-acid-generating agents, compounds generating sulfonic acid are preferred, and oxime sulfonate compounds as illustrated below are particularly preferred from the viewpoint of the high sensitivity.

[Chem. 1]

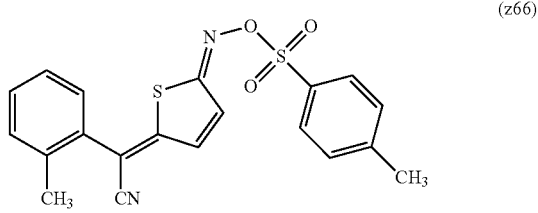

(z66)

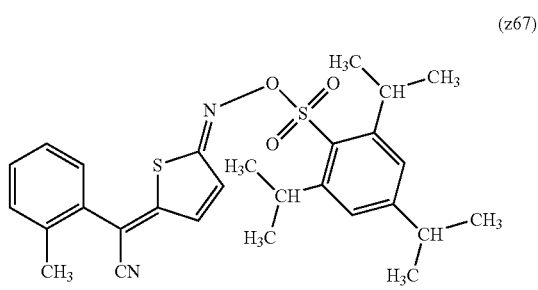

(z67)

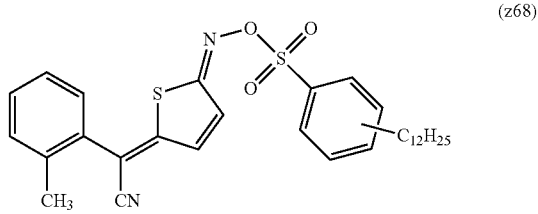

(z68)

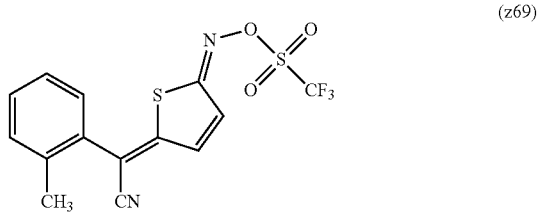

(z69)

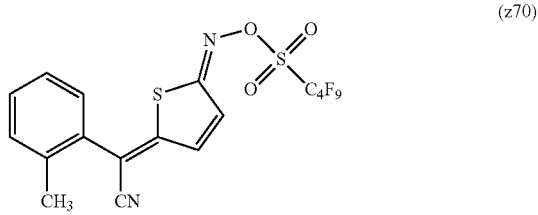

(z70)

When a compound having an 1,2-naphtoquinone diazide group is used as the quinone diazide compound, the sensitivity is high, and the developing properties are favorable.

Among the quinone diazide compounds, the following compounds in which D is independently a hydrogen atom or an 1,2-naphtoquinone diazide group are preferred from the viewpoint of the high sensitivity.

[Chem. 2]

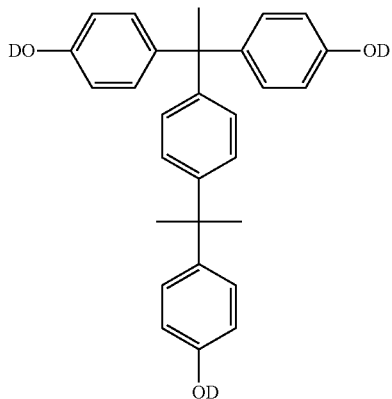

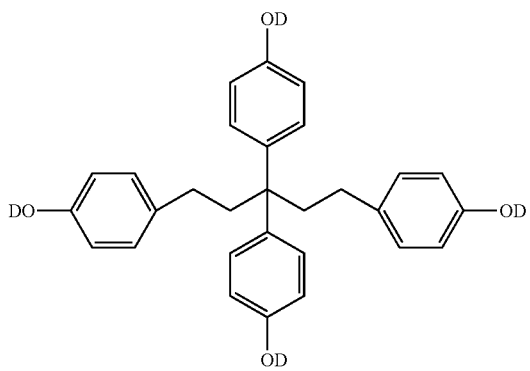

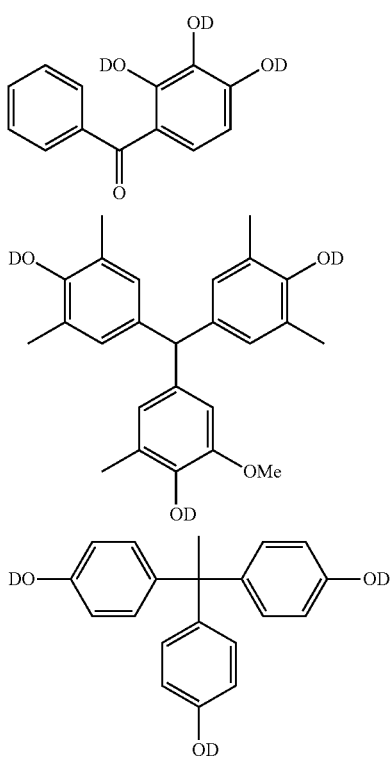

D = H or 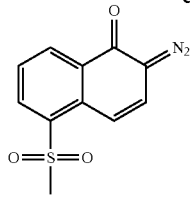

—Photo-Radical-Generating Agent—

The photo-radical-generating agent is a compound that directly absorbs light or is photosensitized so as to cause a decomposition reaction or a hydrogen abstraction reaction, and has a radical-generating function. The photo-radical-generating agent is preferably a compound absorbing light having a wavelength in a range of 300 nm to 500 nm.

A number of compounds are known as the above-described photo-radical-generating agent, and examples thereof include triazine-based compounds, carbonyl compounds, ketal compounds, benzoin compounds, acridine compounds, organic peroxide compounds, azo compounds, coumarin compounds, azide compounds, metallocene compounds, hexaaryl biimidazole compounds, organic boric acid compounds, disulfonic acid compounds, oxime ester compounds, and acyl phosphine (oxide) compounds which are described in JP2008-268884A. The above-described compounds can be appropriately selected depending on purposes. Among the above-described compounds, benzophenone compounds, acetophenone compounds, hexaaryl biimidazole compounds, oxime ester compounds, and acyl phosphine (oxide) compounds are particularly preferred from the viewpoint of the exposure sensitivity.

As the photo-radical-generating agent, it is possible to use, for example, the photo-radical-generating agents described in JP2011-018636A and JP2011-254046A.

The photopolymerizable initiator may be solely used, or two or more photopolymerization initiators may be jointly used. The content thereof is preferably in a range of 0.1 mass % to 50 mass %, more preferably in a range of 0.5 mass % to 30 mass %, and still more preferably in a range of 1 mass % to 20 mass % on the basis of the total mass of the solid content of the photopolymerizable composition including the metal nanowires. In a case in which a pattern including conductive regions and non-conductive regions that will be described below is formed on the conductive layer with the content of the photopolymerizable initiator within the above-described numeric range, favorable sensitivity and pattern formability can be obtained.

Examples of additives other than the above-described components (a) and (b) include a variety of additives such as a chain transfer agent, a crosslinking agent, a dispersant, a solvent, a surfactant, an antioxidant, a sulfurization inhibitor, a metal corrosion inhibitor, a viscosity adjuster, and an antiseptic agent.

[Chain Transfer Agent]

The chain transfer agent is used to improve the exposure sensitivity of the photopolymerizable composition. Examples of the chain transfer agent include N,N-dialkyl amino alkyl benzate ester such as N,N-dimethyl amino ethyl benzoate ester; mercapto compounds having a heterocyclic ring such as 2-mercaptobenzothiazole, 2-mercaptobenzooxazole, 2-mercaptobenzoimidazole, N-phenylmercaptobenzoimidazole, and 1,3,5-tris(3-mercaptobutyloxyethyl)-1,3,5-triazine-2,4,6(1H,3H,5H)-trione; aliphatic polyfunctional mercapto compounds such as pentaerythritol tetraquis(3-mercaptopropionate), pentaerythritol tetrakis(3-mercaptobutylate), and 1,4-bis(3-mercaptobutylyloxy)butane; and the like. The above-described chain transfer agents may be solely used, or two or more chain transfer agents may be jointly used.

The content of the chain transfer agent is preferably in a range of 0.01 mass % to 15 mass %, more preferably in a range of 0.1 mass % to 10 mass %, and still more preferably in a range of 0.5 mass % to 5 mass % on the basis of the total mass of the solid content of the photopolymerizable composition including the metal nanowires.

[Crosslinking Agent]

The crosslinking agent is a compound that forms a chemical bond using a free radical or an acid and heat, and cures the conductive layer, and examples thereof include melamine-based compounds substituted by at least one group selected from a methylol group, an alkoxy methyl group, and an acyloxy methyl group, guanamine-based compounds, glycoluril-based compounds, urea-based compounds, phenol-based compounds or ether compounds of phenol, epoxy-based compounds, oxetane-based compounds, thioepoxy compounds, isocyanate-based compounds, azide-based compounds, compounds having an ethylenic unsaturated group such as a methacryloyl group or an acryloyl group, and the like. Among the above-described crosslinking agents, epoxy-based compounds, oxetane-based compounds, and compounds having an ethylenic unsaturated group are particularly preferred in terms of film properties, thermal resistance, and solvent resistance.

Meanwhile, the oxetane-based compound can be solely used, or can be mixed with an epoxy-based compound for use. Particularly, it is preferable to jointly use the oxetane-based compound with an epoxy-based compound since the reactivity is high, and the film properties are improved.

Meanwhile, in a case in which a compound having an ethylenic unsaturated double bond group is used as the crosslinking agent, the crosslinking agent is also contained in the polymerizable compound, and it is necessary to consider that the content of the crosslinking agent is within the content of the polymerizable compound in the invention.

The content of the crosslinking agent is preferably in a range of 1 part by mass to 250 parts by mass, and more preferably in a range of 3 parts by mass to 200 parts by mass when the total mass of the solid content of the photopolymerizable composition including the metal nanowires is set to 100 parts by mass.

[Dispersant]

The dispersant is used to prevent the aggregation of the metal nanowires and disperse the metal nanowires in the photopolymerizable composition. The dispersant is not particularly limited as long as the dispersant is capable of dispersing the metal nanowires, and can be appropriately selected depending on purposes. For example, it is possible to use a dispersant that is commercially available as a pigment dispersant, and particularly, a polymer dispersant having a property of being adsorbed to the metal nanowires is preferred. Examples of the polymer dispersant include polyvinyl pyrrolidone, BYK series (manufactured by BYK Japan KK), SOLSPERSE series (manufactured by The Lubrizol Corporation), AJISPERSE series (manufactured by Ajinomoto Co., Inc.), and the like.

Meanwhile, in a case in which the polymer dispersant is further added separately as the dispersant in addition to the dispersant used for the manufacturing of the metal nanowires, the polymer dispersant is also contained in the binder, and it is necessary to consider that the content of the polymer dispersant is within the content of the dispersant.

The content of the dispersant is preferably in a range of 0.1 parts by mass to 50 parts by mass, more preferably in a range of 0.5 parts by mass to 40 parts by mass, and particularly preferably in a range of 1 part by mass to 30 parts by mass with respect to 100 parts by mass of the binder.

It is preferable to set the content of the dispersant to 0.1 parts by mass or more since the aggregation of the metal nanowires in the dispersion liquid is effectively suppressed, and to set the content to 50 parts by mass or less since a stable liquid film is formed in a coating step, and the occurrence of an uneven coat is suppressed.

[Solvent]

The solvent is a component used to turn a composition containing the metal nanowires, the specific alkoxide compound, and the photopolymerizable composition into a coating fluid for forming a film on the base material surface, and can be appropriately selected depending on purposes. Examples of the solvent include propylene glycol monomethyl ether (PGME), propylene glycol monomethyl ether acetate (PGMEA), ethyl 3-ethoxypropionate, 3-methyl methoxypropionate, ethyl lactate, 3-methoxybutanol, water, 1-methoxy-2-propanol, isopropyl acetate, methyl lactate, N-methylpyrrolidone (NMP), γ-butyrolactone (GBL), propylene carbonate, and the like. The solvent may double as at least a part of the solvent in the dispersion liquid of the metal nanowires. The above-described solvents may be solely used, or two or more solvents may be jointly used.

The solid content concentration of the coating fluid containing the above-described solvent is preferably in a range of 0.1 mass % to 20 mass %.

[Metal Corrosion Inhibitor]

The photopolymerizable composition preferably contains a metal corrosion inhibitor of the metal nanowires. The metal corrosion inhibitor is not particularly limited, and can be appropriately selected depending on purposes. Preferable examples thereof include thiols, azoles, and the like.

When the metal corrosion inhibitor is contained, it is possible to exhibit an anti-rust effect and to suppress the degradation of the conductive properties and transparency of a conductive material over time. The metal corrosion inhibitor can be added to a composition for forming a photosensitive layer in a state of being dissolved in a suitable solvent or in a powder form, or can be supplied by producing a conductive film using the below-described coating fluid for a conductive layer, and then immersing the conductive film in a metal corrosion inhibitor bath.

In a case in which the metal corrosion inhibitor is added, the content thereof is preferably set in a range of 0.5 mass % to 10 mass % with respect to the metal nanowires.

Additionally, regarding the matrix, the polymer compound serving as the dispersant used for the manufacturing of the metal nanowires can be used as at least a part of components that configure the matrix.

For the formation of the conductive layer, it is also possible to use a composition containing at least a sol-gel cured substance as a matrix component together with the metal nanowires.

<Sol-Gel Cured Substance>

The above-described sol-gel cured substance is a substance obtained by hydrolyzing and polycondensing an alkoxide compound of an element selected from the group consisting of Si, Ti, Zr, and Al (hereinafter, also referred to as "specific alkoxide compound"), and furthermore, heating and drying the alkoxide compound as desired.

[Specific Alkoxide Compound]

The specific alkoxide compound is preferably a compound represented by the following general formula (II) in terms of easy procurement, $$M^1(OR^1)_a R^2_{4-a} \quad \text{(II)}$$

(in the general formula (II), $M^1$ represents an element selected from Si, Ti, and Zr, each of $R^1$ and $R^2$ individually represents a hydrogen atom or a hydrocarbon group, and $a$ represents an integer of 2 to 4).

The hydrocarbon group of each of $R^1$ and $R^2$ in the general formula (II) is preferably an alkyl group or an aryl group.

In a case in which the hydrocarbon group is an alkyl group, the number of carbon atoms is preferably in a range of 1 to 18, more preferably in a range of 1 to 8, and still more preferably in a range of 1 to 4. In addition, in a case in which the hydrocarbon group is an aryl group, a phenol group is preferred.

The alkyl group or aryl group may have a substituent, and examples of the substituent that can be introduced include a halogen atom, an amino group, an alkylamino group, a mercapto group, and the like.

Meanwhile, the compound represented by the general formula (II) is a low-molecular-weight compound, and the molecular weight is preferably 1000 or less.

Specific examples of the compound represented by the general formula (II) are described in, for example, JP2010-064474A.

When the compound represented by the general formula (II) is hydrolyzed, polycondensed, and furthermore, heated, and dried as desired, thereby forming a film, a matrix configured by including a three-dimensional crosslinking bond which includes a bond represented by the following general formula (I) is produced, $$-M^1-O-M^1- \quad \text{(I)}$$

($M^1$ represents an element selected from Si, Ti, and Zr).

In the invention, in a case in which the sol-gel cured substance is used as the matrix for the conductive layer, the sol-gel cured substance is used at the ratio of the specific alkoxide compound to the metal nanowires, that is, the mass ratio of the specific alkoxide compound/the metal nanowires in a range of 0.25/1 to 30/1. In a case in which the mass ratio is smaller than 0.25/1, the transparency deteriorates, and at least one of the abrasion resistance, thermal resistance, moist heat resistance, and bend resistance of the conductive layer are poor. On the other hand, when the mass ratio is greater than 30/1, the conductive properties and bend resistance of the conductive layer are poor.

The mass ratio is more preferably in a range of 0.5/1 to 20/1, still more preferably in a range of 1/1 to 15/1, and most preferably in a range of 2/1 to 8/1 since it is possible to stably obtain a conductive material that has favorable conductive properties and high transparency (total light transmittance and haze), is excellent in terms of abrasion resistance, thermal resistance, and moist heat resistance, and has excellent bend resistance.

To accelerate a sol-gel reaction, it is preferable to jointly use an acidic catalyst or a basic catalyst since the reaction efficiency increases.

[Catalyst]

Any catalyst can be used as the catalyst as long as the catalyst accelerates the reaction of the hydrolysis and polycondensation of the specific alkoxide compound.

The above-described catalyst contains an acidic or basic compound, and is used as it is or is used in a state of being dissolved in water or a solvent such as an alcohol (hereinafter, also collectively called an acidic catalyst or a basic catalyst).

There is no particular limitation regarding the concentration of the compound when the acidic or basic compound is dissolved in a solvent, and the concentration may be appropriately selected depending on the characteristics of the acidic or basic compound being used, the desired content of the catalyst, and the like. Here, in a case in which the concentration of the acidic or basic compound configuring the catalyst is high, there is a tendency of the hydrolysis and polycondensation rate becoming fast. However, when a basic catalyst having an excessively high concentration is used, there is a case in which sediment is generated and appears as a defect in the conductive layer. Therefore, in a case in which a basic catalyst is used, the concentration of the compound is desirably 1 N or less in terms of the concentration in an aqueous solution.

There is no particular limitation regarding the type of the acidic catalyst or the basic catalyst; however, in a case in which it is necessary to use a catalyst having a high concentration, a catalyst made up of elements that rarely remain in the conductive layer is preferred. Specific examples of the acidic catalyst include halogenated hydrogen such as hydrochloric acid; carboxylic acids such as nitric acid, sulfuric acid, sulfurous acid, hydrogen sulfide, perchloric acid, hydrogen peroxide, carbonic acid, formic acid, and acetic acid; substituted carboxylic acids obtained by substituting R in the structural formula represented by RCOOH by another element or substituent; sulfonic acid such as benzenesulfonic acid; and the like, and specific examples of the basic catalyst include ammoniacal bases such as ammonia water; amines such as ethylamine and aniline; and the like.

A Lewis acid catalyst made of a metal complex can also be used. A particularly preferred catalyst is a metal complex catalyst, which is a metal complex made up of a metal element selected from Groups 2, 3, 4, and 5 in the periodic table and an oxo or hydroxyl oxygen-containing compound selected from β-diketone, ketoester, hydroxycarboxylic acid or esters thereof, amino alcohols, and enolic active hydrogen compounds.

Among the constituent metal elements, Group 2 elements such as Mg, Ca, Sr, and Ba, Group 13 elements such as Al and Ga, Group 4 elements such as Ti and Zr, and Group 5 elements such as V, Nb and Ta are preferred, and each element forms a complex having an excellent catalytic effect. Among the above-described complexes, complexes obtained from Zr, Al, and Ti are excellent and preferable.

In the invention, examples of the oxo or hydroxyl oxygen-containing compound configuring ligands of the metal complex include β-diketones such as acetyl acetone (2,4-pentanedione) and 2,4-phetanedione; ketoesters such as methyl acetoacetate, ethyl acetoacetate, and butyl acetoacetate; hydroxycarboxylic acids and esters thereof such as lactic acid, methyl lactate, salicylic acid, ethyl salicylate, phenyl salicylate, malic acid, tartaric acid, and methyl tartarate; keto alcohols such as 4-hydroxy-4-methyl-2-pentanone, 4-hydroxy-2-pentanone, 4-hydroxy-4-methyl-2-heptanone, and 4-hydroxy-2-heptanone; amino alcohols such as monoethanol amine, N,N-dimethyl ethanol amine, N-methyl-monoethanol amine, diethanol amine, and triethanol amine; enolic active compounds such as methylol melamine, methylol urea, methylol acrylamide, and diethyl ethylmalonate; and compounds having a substituent instead of the methyl group, methylene group, or carbonyl carbon of acetylacetone (2,4-pentanedione).

A preferable ligand is an acetyl acetone derivative, and in the invention, the acetyl acetone derivative refers to a compound having a substituent instead of the methyl group, methylene group, or carbonyl carbon in acetylacetone. The substituent substituting the methyl group in acetyl acetone is a straight or branched alkyl group, acyl group, hydroxyalkyl group, carboxyalkyl group, alkoxy group, or alkoxy alkyl group having 1 to 3 carbon atoms, the substituent substituting the methylene group in acetyl acetone is a carboxyl group, or a straight or branched carboxyalkyl group and hydroxyalkyl group having 1 to 3 carbon atoms, and the substituent substituting the carbonyl carbon in acetyl acetone is an alkyl group having 1 to 3 carbon atoms, and in this case, a hydrogen atom is added to carbonyl oxygen, thereby producing a hydroxyl group.

Specific examples of the preferable acetyl acetone derivative include ethyl carbonyl acetone, n-propyl carbonyl acetone, i-propyl carbonyl acetone, diacetyl acetone, 1-acetyl-1-propionyl-acetylacetone, hydroxyl ethyl carbonyl acetone, hydroxyl propyl carbonyl acetone, acetoacetate, aceto propionate, diacetoacetate, 3,3-diaceto propionate, 4,4-diacetoacetate, carboxyethyl carbonyl acetone, carboxy propyl carbonyl acetone, and diacetone alcohol. Among the above-described acetyl acetone derivatives, acetyl acetone and diacetyl acetone are particularly preferred. The complex of the above-described acetyl acetone derivative and the above-described metal element is a mononuclear complex in which the metal element is coordinated with one to four acetyl acetone derivatives, and in a case in which the number of possible coordination bonds of the metal element is greater than the total number of possible coordination bonds of the acetyl acetone derivatives, the metal element may be coordinated with ligands that are generally used in an ordinary complex such as a water molecule, a halogen ion, a nitro group, or an ammonio group.

Examples of the preferable metal complex include tris(acetylacetonato)aluminum complex, di(acetylacetonato) aluminum, aquo complex salt, mono(acetylacetonato)aluminum-chloro complex salt, di(diacetylacetonato)aluminum complex salt, ethylacetoacetate aluminium diisopropylate, aluminum tris(ethylacetoacetate), cyclic aluminum oxide isopropylate, tris(acetylacetonato)barium complex salt, di(acetylacetonato)titanium complex salt, tris(acetylacetonato)titanium complex salt, di-i-propoxy-bis(acetylacetonato) titanium complex salt, zirconium tris(ethylacetoacetate), dizirconium tris(benzoate) complex salt, and the like. The above-described metal complexes are excellent in terms of stability in an aqueous coating fluid and the gelation-accelerating effect in a sol-gel reaction during heating and drying. Among the above-described metal complexes, ethylacetoacetate aluminum diisopropylate, aluminum tris(ethylacetoacetate), di(acetylacetonato)titanium complex salt, and zirconium tris(ethylacetoacetate) are preferred.

While the specification does not describe anything about the pair salt of the above-described metal complex, the type of the pair salt is arbitrary as long as the pair salt is a water-soluble salt that maintains the charge neutrality as the complex compound, and, for example, a form of a salt with which the stoichiometric neutrality is ensured such as nitrate, halogen acid salt, hydrosulfate, or phosphate is used.

Regarding the behaviors of the metal complex in a silica sol-gel reaction, there is a detailed description in J. Sol-Gel. Sci. and Tec. 16. 209 (1999). The following scheme is presumed as the reaction mechanism. That is, it is considered that, in the coating fluid, the metal complex has a coordination structure and is stable, and in a dehydration and condensation reaction beginning in a heating and drying step which follows coating, crosslinking is accelerated with a mechanism that is similar to that of the acidic catalyst. In any cases, the use of the metal complex leads to excellence in terms of the stability of the coating fluid over time, the qualities of the coat surface of the conductive layer, and favorable durability.

The above-described metal complex catalyst can be easily procured from commercially available products, and can be obtained using a well-known synthesizing method, for example, a reaction between individual metal chlorides and alcohols.

The catalyst according to the invention is used in the below-described sol-gel coating fluid at a ratio to nonvolatile components in the coating fluid preferably in a range of 0 mass % to 50 mass %, and more preferably in a range of 5 mass % to 25 mass %. The catalyst may be solely used, or a combination of two or more catalysts may be used.

[Solvent]

The sol-gel coating fluid may contain an organic solvent as desired to ensure the uniform formability of a coating fluid film on the substrate.

Examples of the above-described organic solvent include ketone-based solvents such as acetone, methyl ethyl ketone, and diethyl ketone; alcohol-based solvents such as methanol, ethanol, 2-propanol, 1-propanol, 1-butanol, and tert-butanol; chlorine-based solvents such as chloroform and methyl chloride; aromatic solvents such as benzene and toluene; ester-based solvents such as ethyl acetate, butyl acetate, and isopropyl acetate; ether-based solvents such as diethyl ether, tetrahydrofuran, and dioxane; glycol ether-based solvents such as ethylene glycol monomethyl ether, ethylene glycol dimethyl ether; and the like.

In this case, it is effective to add the organic solvent within a range in which no problem occurs in relation to volatile organic compounds (VOC), and the content is preferably 50 mass % or less, and more preferably 30 mass % or less with respect to the total mass of the sol-gel coating fluid.

In the coating fluid film of the sol-gel coating fluid formed on the substrate, the hydrolysis and polycondensation reaction of the specific alkoxide compound is caused, and it is preferable to heat and dry the coating fluid film to accelerate the reaction. The heating temperature for accelerating the sol-gel reaction is suitably in a range of 30° C. to 200° C., and more preferably in a range of 50° C. to 180° C. The heating and drying time is preferably in a range of 10 seconds to 300 minutes, and more preferably in a range of 1 minute to 120 minutes.

The surface resistance of the conductive layer is preferably in a range of 1 Ω/square to 1,000 Ω/square, and more preferably in a range of 1 Ω/square to 200 Ω/square.

The surface resistance can be measured using, for example, a surface resistance meter (manufactured by Mitsubishi Chemical Corporation, Loresta-GP MCP-T600).

The thickness of the conductive layer in the invention is preferably in a range of 0.01 μm to 2 μm, more preferably in a range of 0.02 μm to 1 μm, still more preferably in a range of 0.03 μm to 0.8 μm, and further more preferably in a range of 0.05 μm to 0.5 μm. When the film thickness is set in a range of 0.01 μm to 2 μm, sufficient durability and film strength can be obtained. Particularly, when the film thickness is set in a range of 0.05 μm to 0.5 μm, the manufacturing allowance is ensured, which is preferable.

The haze of the conductive layer is preferably in a range of 0.01 to 2.0, more preferably in a range of 0.01 to 1.0, and particularly preferably in a range of 0.01 to 0.5. Here, the haze of the conductive layer is the intrinsic haze of the conductive layer excluding the haze values of other constituent materials for the substrate and the like.

(Light-Scattering Layer)

The light-scattering layer according to the invention is made up of the non-conductive light-scattering fine particles and a matrix. In the invention, the light-scattering layer does not have conductive properties, and is thus a non-conductive layer. The matrix of the light-scattering layer may be the same as the matrix for the conductive layer, or may be a different matrix; however, from the viewpoint of reducing the appearance of a pattern by decreasing the visibility of the conductive layer and the light-scattering layer, it is preferable to use a matrix having the same main components.

<Light-Scattering Fine Particles (Non-Conductive Light-Scattering Fine Particles)>

In the invention, the light-scattering fine particles refer to particles that are small enough to be housed within the thickness of the pattern-formed light-scattering layer (non-conductive regions), are electrically insulating, and exhibit light-scattering properties.

The insulating property means that the bulk volume resistivity of the fine particle component is $10^5$ Ωm or more. In a case in which the fine particles are in a multilayer structure, the respective layers are weight-averaged in terms of the bulk volume resistivity at a thickness ratio of the particles in the short axis direction, and the weight-averaged value is considered as the volume resistivity of the fine particles.

The light-scattering property refers to a property of increasing the haze as a result of the formation of a fine particle layer, and is not limited by quantitative characteristics.

The fine particles of the light-scattering fine particles refer to particles that are small enough to be housed within the width of the pattern-formed light-scattering layer (non-conductive regions). The shape of the fine particle is not particularly limited, and examples thereof include a spherical shape, a flat plate shape, a rod shape, a wire (fiber) shape, and the like. Here, in a case in which the particle has a wire shape, the long axis length of the fiber may exceed the width of the pattern-formed non-conductive region as long as the particles are housed within the width of the pattern-formed non-conductive region through refraction or bending.

Examples of the light-scattering fine particles include inorganic oxide fine particles, inorganic nitride fine particles, inorganic sulfide fine particles, or inorganic phosphide fine particles containing at least one atom (element) selected from the group consisting of (Ti, Zr, Cr, Mo, Fe, Ru, Co, Rh, Ni, Pd, Cu, Ag, Zn, Cd, Al, Ga, and In), organic high-refractive-index polymer fine particles, metal fine particles containing at least one atom selected from the group consisting of (Fe, Ru, Os, Co, Rh, Ir, Ni, Pd, Pt, Cu, Ag, Au, Zn, Cd, Al, Ga, and In) that are deprived of conductive properties by a surface treatment, resin particles such as acryl particles and crosslinked acryl particles, and the like. The above-described light-scattering fine particles can be solely used, or two or more kinds of light-scattering fine particles may be used. Among the above-described light-scattering fine particles, inorganic compound particles are preferred, and silica particles are preferred due to easy procurement.

The specific particle diameter of the light-scattering fine particles is preferably in a range of 0.1 μm to 2 μm, more preferably in a range of 0.1 μm to 1 μm, and particularly preferably in a range of 0.1 μm to 0.5 μm. In a case in which the particle diameter of the light-scattering fine particles is smaller than 0.1 μm, a sufficient light-scattering effect cannot be obtained, and there is a case in which it is not possible to increase the haze.

The specific content of the light-scattering fine particles is preferably in a range of 0.005 mg/m² to 20 mg/m², more preferably in a range of 0.05 mg/m² to 15 mg/m², and particularly preferably in a range of 0.1 mg/m² to 10 mg/m² in the light-scattering layer.

The same matrix as the matrix for the conductive layer can be used as the matrix for the light-scattering layer. In addition, the same dispersant as the dispersant contained in the matrix can be used as a dispersant for the light-scattering fine particles.

The thickness of the light-scattering layer is preferably in a range of 0.01 μm to 2 μm, more preferably in a range of 0.02 μm to 1 μm, still more preferably in a range of 0.03 μm to 0.8 μm, and further more preferably in a range of 0.05 μm to 0.5 μm. When the film thickness is set in a range of 0.01 μm to 2 μm, sufficient durability and film strength can be obtained. Particularly, when the film thickness is set in a range of 0.05 μm to 0.5 μm, the manufacturing allowance is ensured, which is preferable. Meanwhile, the thickness of the light-scattering layer does not include the height of the fine particles.

Meanwhile, the difference in thickness between the conductive layer and the light-scattering layer is preferably 500% or less, more preferably 100% or less, and still more preferably substantially 0% of the thickness of a thinner one of the conductive layer and the light-scattering layer. When the difference in the film thickness is great, the pattern becomes easily visible due to the unevenness-induced scattered reflection of light, or air is likely to flow into the uneven portions when the conductive member is attached to a display apparatus or the like, and therefore it is preferable to decrease the difference in the film thickness as much as possible. Meanwhile, "being substantially 0%" means that inevitably generated local defect portions are permitted.

In addition, the haze in the light-scattering layer is preferably in a range of 0.01 to 2.0, more preferably in a range of 0.01 to 1.0, and particularly preferably in a range of 0.01 to 0.5.

The ratio of haze between the conductive layer and the light-scattering layer (the haze of the light-scattering layer/the haze of the conductive layer) is preferably in a range of 0.7 to 1.3, more preferably in a range of 0.8 to 1.2, and particularly preferably in a range of 0.9 to 1.1.

The difference between the haze of the conductive layer and the haze of the light-scattering layer is preferably decreased by adjusting the concentration of the light-scattering fine particles in the light-scattering layer.

Method for Manufacturing the Conductive Member:

The method for manufacturing the conductive member includes a step of forming any one of the conductive layer including the metal nanowires and the light-scattering layer including the light-scattering fine particles on the substrate in a pattern shape (hereinafter, also called "patterning"); and a step of forming the other layer between sections of the above-described patterned layer. In a case in which the earlier-formed layer is the conductive layer, the later-formed layer is the light-scattering layer, and in a case in which the earlier-formed layer is the light-scattering layer, the later-formed layer is the conductive layer. Meanwhile, "forming the other layer between sections of the patterned layer" means that the other layer is formed in sections from which the patterned layer is removed, or the other layer is formed between sections of the layer patterned through pattern printing as illustrated in FIG. 8 (in FIG. 8, the earlier-formed layer is the layer 1, and the later-formed layer is the layer 2, which shall apply to FIGS. 3 to 10). That is, the method for manufacturing the conductive member includes forming the conductive layer including metal nanowires on the substrate in a pattern shape, and then forming the light-scattering layer including non-conductive light-scattering fine particles on a space of the substrate wherein the conductive layer is not formed; or forming a light-scattering layer including non-conductive light-scattering fine particles on a substrate in a pattern shape, and then forming a conductive layer including metal nanowires on a space of the substrate wherein the light-scattering layer is not formed.

Meanwhile, "the step of forming any one of the conductive layer including the metal nanowires and the light-scattering layer including the light-scattering fine particles on the substrate in a pattern shape" refers to, for example, a step in which one layer is formed and patterned or a step in which pattern printing is carried out so as to apply one layer in a pattern shape, but the step is not limited to the above-described steps.

Hereinafter, examples of the method for manufacturing the conductive member will be described with reference to FIGS. 3 to 10, but the invention is not limited thereto. Meanwhile, the order of forming the conductive layer and the light-scattering layer is not particularly limited.

First, a coating fluid for the conductive layer is prepared. The coating fluid contains at least the metal nanowires, and can be preferably prepared using an ordinary method by mixing the metal nanowires and a binder, furthermore, a photosensitive compound if necessary, and other components.

Next, the coating fluid for the conductive layer is applied on the substrate surface such as a glass plate or a film. The coating method is not particularly limited, and can be appropriately selected depending on purposes. Examples thereof include a spray coat method, an air blush method, a curtain spray method, a dip coat method, a roller coat method, a spin coat method, an ink jet method, an extrusion method, a bar coat method, a casting method, a die coat method, a blade coat method, a gravure coat method, a doctor coat method, and the like. The coating fluid for the conductive layer is preferably applied at a coating amount so that the content of the metal nanowires in the conductive layer falls in a range of 1.0 $mg/m^2$ to 150.0 $mg/m^2$.

Meanwhile, instead of applying the coating fluid for the conductive layer onto the substrate surface, it is also possible to prepare a coating fluid for the light-scattering layer, and apply the coating fluid to the substrate surface, thereby forming the light-scattering layer.

In addition, in the coating step performed to form the conductive layer, when the orientation of the metal nanowires is accelerated, there is a tendency of forming a polarizable conductive layer. Examples of the coating method that allows the orientation of the nanowires to be randomly maintained include a spray coating method, an ink jet coating method, and the like. In addition, even in a case in which a coating method that accelerates the orientation of the nanowires (for example, a coating method such as a throttle die method) is employed, it is possible to mitigate the orientation of the nanowires by applying the coating fluid in one direction, and then applying the coating fluid in a direction different from the above-described direction (for example, an intersecting direction).

In addition, after the conductive layer is formed, a treatment for reducing the orientation of the metal nanowires in the conductive layer may be carried out. The metal nanowires in the conductive layer formed by applying the coating fluid in one direction tend to be oriented in the same direction. Therefore, it is preferable to carry out a stretching treatment (for example, a stretching treatment with a stretching ratio in a range of 1% to less than 5%) in a direction different from the coating direction (for example, an intersecting direction) since the orientation is reduced. Meanwhile, in a case in which the stretching treatment is carried out, it is preferable to form the conductive layer on a flexible substrate such as a polymer film, and then stretch the conductive layer in a state of being supported by a substrate together with the substrate.

Next, a step of forming the formed conductive layer or light-scattering layer in a pattern shape is carried out. That is, the one layer of the conductive layer or the light-scattering is patterned. Hereinafter, examples of the method for manufacturing the conductive member will be described below with an assumption that any one of the layer 1 and the layer 2 corresponds to the conductive layer, and the other corresponds to the light-scattering layer. Meanwhile, the layer 2 is formed after forming the layer 1. In addition, there is a case in which the conductive layer formed in a pattern shape and the light-scattering layer formed in a pattern shape are called the "patterned conductive layer" and the "patterned light-scattering layer" respectively.

As illustrated as examples in FIGS. 7 to 10, in a case in which the layer 1 is formed through pattern printing, it is not necessary to form and then pattern the conductive layer or the light-scattering layer, and instead, the layer 1 is formed by directly printing the layer 1 in a pattern shape on the substrate surface.

Any method may be employed as the method for forming the patterned conductive layer and the patterned light-scattering layer (the method for forming the conductive layer and the light-scattering layer in a pattern shape) as long as the method is capable of forming the respective layers to be substantially not overlapped, and the method is not limited to the following methods. Here, "being substantially not overlapped" means that it is permitted for some portions to be inevitably overlapped each other for the reasons of the accuracy of forming the layers in a pattern shape.

Figure 3:
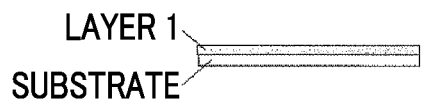
FIG. 3 is a schematic view illustrating an example of a method for manufacturing the conductive member using an etching mask.
Figure 3:
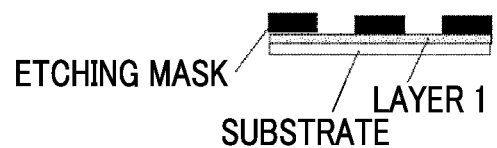
Figure 3:
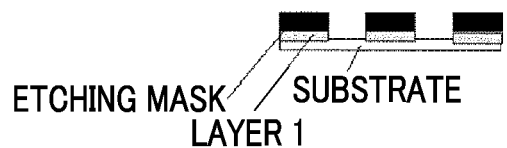
Figure 3:
Figure 3:
Figure 4:
FIG. 4 is a schematic view illustrating an example of the method for manufacturing the conductive member using a positive photoresist.
Figure 4:
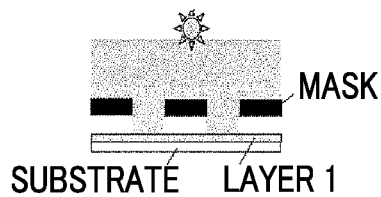
Figure 4:
Figure 4:
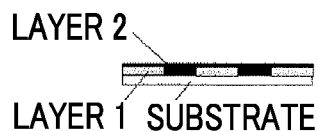
Figure 4:
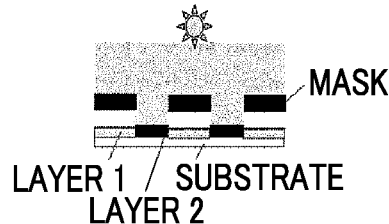
Figure 4:
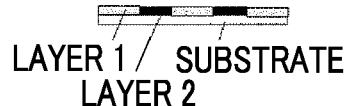
Figure 5:
FIG. 5 is a schematic view illustrating an example of the method for manufacturing the conductive member using a negative photoresist.
Figure 5:
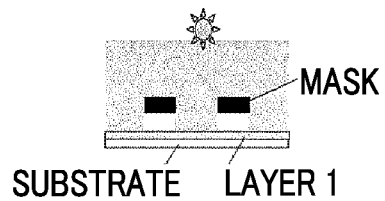
Figure 5:
Figure 5:
Figure 5:
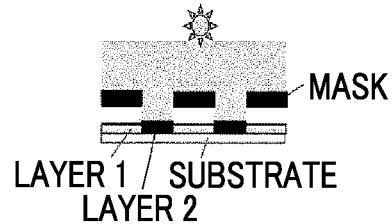
Figure 5:
Figure 6:
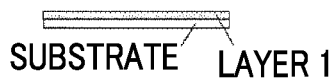
FIG. 6 is a schematic view illustrating an example of the method for manufacturing the conductive member using the negative and positive photoresists.
Figure 6:
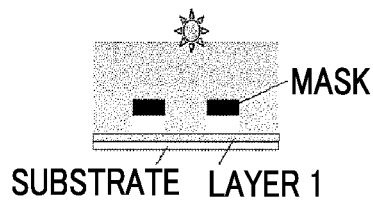
Figure 6:
Figure 6:
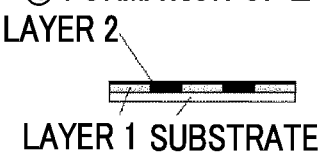
Figure 6:
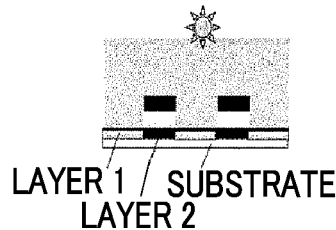
Figure 6:

Examples of the step of forming the patterned conductive layer or the patterned light-scattering layer include (1) a step in which the pattern of the layer 1 is pattern-exposed and developed as illustrated in examples of FIGS. 4 to 6, thereby forming the patterned conductive layer and the patterned light-scattering layer, (2) a step in which, as illustrated in an example of FIG. 3, an etching mask is applied onto the layer 1 in a pattern shape, and a liquid capable of dissolving the layer 1 is applied to openings in the etching mask, thereby forming the patterned conductive layer or the patterned light-scattering layer, (3) a step in which the layer 1 is directly printed in a pattern shape using a variety of printing methods such as screen printing as illustrated in examples of FIGS. 7 to 10, thereby forming the patterned conductive layer or the patterned light-scattering layer, (4) a step in which a solution is printed in a pattern shape after the formation of the layer 1, thereby forming the patterned conductive layer or the patterned light-scattering layer, and the like.

The liquid capable of dissolving the layer 1 refers to a liquid capable of dissolving the conductive layer or a liquid capable of dissolving the light-scattering layer. The liquid capable of dissolving the conductive layer refers to at least any one solution of a liquid capable of dissolving the metal nanowires and a liquid capable of dissolving the matrix for the conductive layer. In addition, the liquid capable of dissolving the light-scattering layer refers to at least any one solution of a liquid capable of dissolving the light-scattering fine particles and a liquid capable of dissolving the matrix for the light-scattering layer.

Hereinafter, (1) to (4) will be described.

The Step (1):

The step (1) is a step in which the pattern of the layer 1 is pattern-exposed and developed as illustrated in examples of FIGS. 4 to 6, thereby forming the patterned conductive layer and the patterned light-scattering layer.

The patterning is the pattern-exposure and development of the pattern of the layer 1 as illustrated in examples of FIGS. 4 to 6, and further includes other steps as necessary.

The pattern-exposure method in the above-described pattern exposure may be surface exposure using a photo-mask or scanning exposure using a laser beam. At this time, the exposure may be refraction-type exposure using a lens or reflection-type exposure using a reflecting mirror, and it is possible to use exposure methods such as contact exposure, proximity exposure, reduced projection exposure, and reflection projection exposure.

The light source being used for the above-described pattern-exposure is selected in consideration of the photosensitive wavelength range of a photoresist composition, and generally, ultraviolet rays such as a g-ray, an h-ray, an i-ray, and a j-ray are preferably used. In addition, an ultraviolet LED may be used.

The method for the pattern-exposure is not particularly limited, and may be surface exposure using a photoresist or scanning exposure using a laser beam or the like. At this time, the exposure may be refraction-type exposure using a lens or reflection-type exposure using a reflecting mirror, and it is possible to use exposure methods such as contact exposure, proximity exposure, reduced projection exposure, and reflection projection exposure.

The above-described development step is a step in which any of the exposed sections and the non-exposed sections in the layer 1 are developed by supplying a solvent as illustrated in the examples in FIGS. 4 to 6.

In the development step, in a case in which a photosensitive layer is provided between the base material and the layer 1, any of the exposed sections and the non-exposed sections in the photosensitive layer are removed.

The solvent is preferably an alkali solution. The alkali contained in the alkali solution is not particularly limited, and can be appropriately selected depending on purposes. Examples thereof include tetramethylammonium hydroxide, tetraethylammonium hydroxide, 2-hydroxyethyl trimethylammonium hydroxide, sodium carbonate, sodium hydrogen carbonate, potassium carbonate, potassium hydrogen carbonate, sodium hydroxide, potassium hydroxide, and the like.

The development method using the alkali solution is not particularly limited, and can be appropriately selected depending on purposes. Examples thereof include a method in which a polarizing plate equipped with the conductive layer of the invention is immersed in the alkali solution, a method in which an organic solvent is showered or sprayed onto a polarizing plate equipped with the conductive layer of the invention, a method in which a polarizing plate equipped with the conductive layer of the invention is smeared using a napkin soaked with the alkali solution, and the like.

The method of supplying the alkali solution is not particularly limited, and can be appropriately selected depending on purposes. Examples thereof include application, immersion, spraying, and the like. Among the above-described methods, immersion is particularly preferred.

The immersion time of the alkali solution is not particularly limited, and can be appropriately selected depending on purposes, but is preferably in a range of 10 seconds to 5 minutes.

The Step (2):

The step (2) is a step in which, as illustrated in an example of FIG. 3, an etching mask is applied onto the layer 1 in a pattern shape, and a solution capable of dissolving the layer 1 is applied to openings in the etching mask, thereby forming the patterned conductive layer or the patterned light-scattering layer, that is, the layer 1 is patterned through pattern etching.

As the method for the pattern etching illustrated in the example of FIG. 3, it is possible to use a method in which the etching mask is formed in a pattern on the preformed layer 1, and the liquid capable of dissolving the layer 1 (a liquid capable of dissolving the matrix on the layer 1, a liquid capable of dissolving the metal nanowires in the layer 1, or a liquid capable of dissolving the light-scattering fine particles in the layer 1) is applied to openings in the mask or the layer 1 is immersed in the solution. Examples of the method for forming a pattern of the etching mask include (A) a method in which a photoresist layer is provided on the layer 1, and a desired pattern is pattern-exposed and developed on the photoresist layer, thereby forming a resist in the desired pattern, (B) a method in which a film that is not soluble in the solution is directly formed in a pattern using a variety of printing methods, (C) a method in which a pattern film that is not soluble in the solution is physically attached to the layer 1, and the like.

The method (A) is described in, for example, JP2010-507199T (particularly in paragraphs 0212 to 0217).

The liquid capable of dissolving the metal nanowires can be appropriately selected depending on the metal nanowires. In a case in which the metal nanowires are silver nanowires, examples thereof include a bleaching fixing liquid, a strong acid, an oxidant, hydrogen peroxide, and the like that are used in the bleaching and fixing step of developing paper of, mainly, a halogenated silver color photosensitive material in a so-called photographic science field. Among the above-described solutions, a bleaching fixing liquid, diluted nitric acid, and hydrogen peroxide are particularly preferred.

The concentration of the diluted nitric acid is preferably in a range of 1 mass % to 20 mass %. The concentration of the hydrogen peroxide is preferably in a range of 3 mass % to 30 mass %.

As the bleaching fixing liquid, for example, the treatment materials or treatment methods described in row 1 of the bottom right column on page 26 to row 9 in the top right column on page 34 of JP1990-207250A (JP-H2-207250A) and in row 17 of the top left column on page 5 to row 20 in the bottom right column on page 18 of JP1992-97355A (JP-H4-97355A) can be preferably applied.

The bleaching fixing time is preferably 180 seconds or shorter, more preferably in a range of 1 second to 120 seconds, and still more preferably in a range of 5 seconds to 90 seconds. In addition, the water-washing or stabilizing time is preferably 180 seconds or less, and more preferably in a range of 1 second to 120 seconds.

The bleaching fixing liquid is not particularly limited as long as the bleaching fixing liquid is a photograph bleaching fixing liquid, and can be appropriately selected depending on purposes. Examples thereof include CP-48S, CP-49E (bleaching fixing agents for color paper) manufactured by Fiji Film Corporation, an EKTACOLOR RA bleaching fixing liquid manufactured by Kodak Japan Ltd., bleaching fixing liquids D-J2P-02-P2, D-30P2R-01, D-22P2R-01 manufactured by Dai Nippon Printing Co., Ltd., and the like. Among the above-described bleaching fixing liquids, CP-48S and CP-49E are particularly preferred.

The viscosity of the liquid capable of dissolving the metal nanowires is preferably in a range of 5 mPa·s to 300,000 mPa·s, and more preferably in a range of 10 mPa·s to 150,000 mPa·s at 25° C. When the viscosity is set to 5 mPa·s or more, it becomes easy to control the diffusion of the solution within a desired range, and a pattern in which boundaries between the conductive regions and the non-conductive regions are clear is ensured. On the other hand, when the viscosity is set to 300,000 mPa·s or less, the load-free printing of the solution is ensured, and it is possible to complete necessary treatments for the dissolution of the metal nanowires within a desired time.

The liquid capable of dissolving the matrix on the layer 1 can be appropriately selected depending on the matrix on the layer 1.

The liquid capable of dissolving the light-scattering fine particles can be appropriately selected depending on the light-scattering fine particles.

The method for applying the liquid capable of dissolving the matrix on the layer 1 is not particularly limited as long as the solution can be applied, and examples thereof include a roll coating method, a bar coating method, a dip coating method, a spin coating method, a casting method, a die coating method, a blade coating method, a gravure coating method, a curtain coating method, a spray coating method, a doctor coating method, and the like.

The etching mask is removed using a well-known solution or through physical peeling.

The Step (3):

The step (3) is a method in which the layer 1 is directly printed in a pattern shape using a variety of printing methods such as screen printing as illustrated in examples of FIGS. 7 to 10, thereby forming the layer 1 in the pattern shape.

The variety of printing methods for directly printing the layer 1 or the etching mask in a pattern illustrated in examples of FIGS. 7 to 10 are not particularly limited as long as a solution for forming the layer 1 or a solution for forming the etching mask can be supplied in a pattern shape, and can be appropriately selected depending on purposes. For example, screen printing, ink jet printing, and the like can be used. As the ink jet printing, for example, any one of the piezo ink jet printing and the thermal ink jet printing can be used.

In addition, the conductive layer may be formed on the substrate in an intended pattern through transfer using a transferring material.

The Step (4):

The step (4) is a method in which a solution is printed in a pattern shape after the formation of the layer 1, thereby forming the patterned conductive layer or the patterned light-scattering layer.

The method for printing the liquid capable of dissolving the metal nanowires in a pattern shape is not particularly limited as long as the solution can be printed in a pattern shape, and can be appropriately selected depending on purposes, and for example, screen printing, ink jet printing, and the like can be used. As the ink jet printing, for example, any one of the piezo ink jet printing and the thermal ink jet printing can be used.

The type of the pattern is not particularly limited, and can be appropriately selected depending on purposes. Examples of the pattern type include a letter, a symbol, a shape, a figure, a wiring pattern, and the like.

The size of the pattern is not particularly limited, and can be appropriately selected depending on purposes, and may be any size in a range of nanomillimeters to millimeters. Specifically, the width of the pattern is preferably in a range of 0.1 µm to 10000 µm, more preferably in a range of 1 µm to 1000 µm, and particularly preferably in a range of 10 µm to 500 µm.

After the layer 1 is patterned, a step in which the layer 2 is formed between sections of the patterned layer 1, that is, a step in which the layer 2 is formed on a space of the substrate which the patterned layer 1 is not formed (sections (regions) from which the layer 1 is removed by the patterning or sections (regions) on which the layer 1 is not formed by the pattern printing as illustrated in the examples of FIGS. 7 to 10), thereby forming the layers 1 and 2 on the substrate is carried out.

Examples of the method for forming the layer 2 in the regions from which the layer 1 is removed (regions in which the layer 1 is not formed) include (A) a method in which the layer 2 including a photosensitive matrix is applied to the layer 1, and then the pattern-exposing and developing are carried out (FIGS. 4 to 6, and FIGS. 9 and 10), (B) a method in which the layer 2 is formed on the layer 1 from which the etching mask is not removed or the surface of the etching mask formed in the same pattern as the pattern of the layer 1 (in actual cases, on the etching mask on the layer 1 and on the regions from which the layer 1 is removed), and only the etching mask below the layer 2 that overlaps the layer 1 is removed using a liquid capable of dissolving of the etching mask (in FIGS. 3 and 7, the layer 2 formed on the etching mask is not illustrated), (C) a method in which the pattern of the layer 2 is printed using a pattern mesh obtained through the negative inversion of the layer 1 and the above-described variety of printing methods (FIG. 8); and the like.

In the method (A), a coating fluid for the layer 2 is applied onto the patterned layer 1 and the regions from which the layer 1 is removed, and pattern-exposing and developing are carried out, thereby forming the layer 2 in the regions from which the layer 1 is removed. As the method for applying the coating fluid for the layer 2, the same method as the method for applying the coating fluid for the layer 1 can be used.

The pattern-exposing and developing carried out in the method (A) can be carried out using the same method as that for the pattern-exposing and developing of the layer 1 as illustrated in examples of FIGS. 4 to 6 and FIGS. 9 and 10. In a case in which the layer 1 is also formed using the photosensitive matrix, that is, through pattern-exposure and development, the combination of the photosensitive matrixes for the layer 1 and the layer 2 can be obtained using a method in which the pattern of the layer 1 is positively exposed and the pattern of the layer 2 is also positively exposed as illustrated in the example of FIG. 4, a method in which the pattern of the layer 1 is negatively exposed and the pattern of the layer 2 is also negatively exposed as illustrated in the example of FIG. 5, or a method in which the pattern of the layer 1 is negatively exposed and the pattern of the layer 2 is also positively exposed as illustrated in the example of FIG. 6. Meanwhile, in a case in which the pattern of the layer 1 is positively exposed and the pattern of the layer 2 is also negatively exposed, the solubility of the layer 1 is increased by the exposure of the pattern of the layer 2, and there is a case in which the layer 1 is peeled off during the development of the layer 2.

Figure 7:
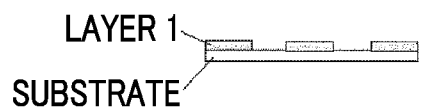
FIG. 7 is a schematic view illustrating an example of the method for manufacturing the conductive member using a printing pattern and a mask pattern.
Figure 7:
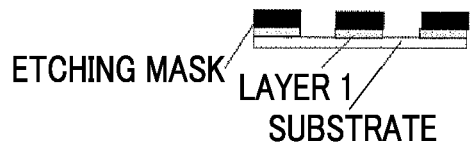
Figure 7:
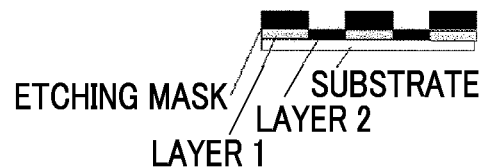
Figure 7:
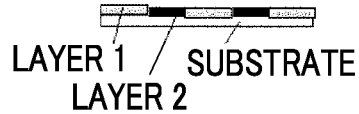
Figure 8:
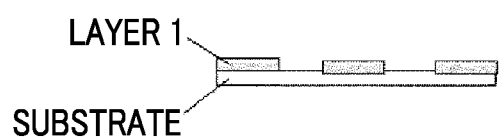
FIG. 8 is a schematic view illustrating an example of the method for manufacturing the conductive member using the printing pattern.
Figure 8:
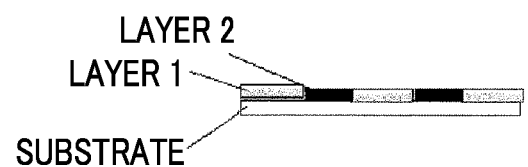
Figure 9:
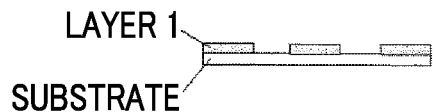
FIG. 9 is a schematic view illustrating an example of the method for manufacturing the conductive member using the printing pattern and the negative photoresist.
Figure 9:
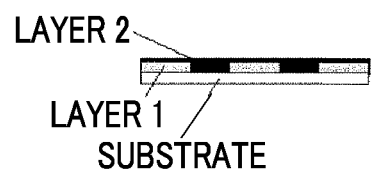
Figure 9:
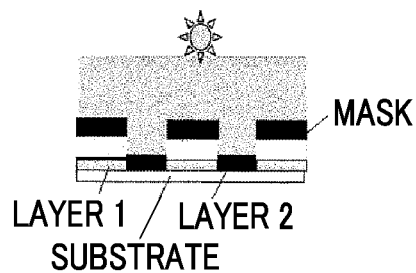
Figure 9:
Figure 10:
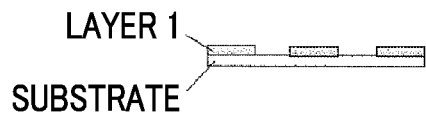
FIG. 10 is a schematic view illustrating an example of the method for manufacturing the conductive member using the printing pattern and the positive photoresist.
Figure 10:
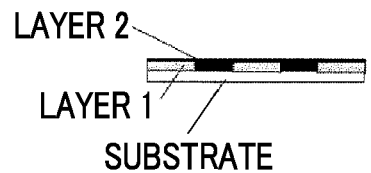
Figure 10:
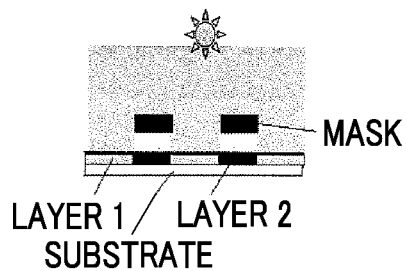
Figure 10:
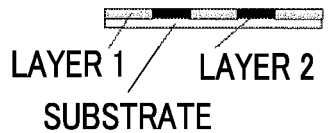

In the method (B), after the liquid capable of dissolving the layer 1 is applied, the coating fluid for the layer 2 is applied through the photoresist or the openings in the mask, and the photoresist or the mask is peeled off, thereby forming the layer 2 as illustrated in the examples of FIGS. 3 and 7. The layer 2 can be coated using the same method as the method for applying the coating fluid for the layer 1. In the method (B), the etching mask used to form the pattern of the layer 1 can also be used as the mask for forming the pattern of the layer 2.

<The Aspect of the Conductive Member>

The aspect of the conductive member of the invention observed from a direction perpendicular to the substrate surface includes the conductive layer that is the conductive region and the light-scattering layer formed of the non-conductive regions. The number of the metal nanowires per unit area of the light-scattering layer is 5% or less, preferably 1% or less, and more preferably substantially 0% of the number of the metal nanowires per unit area of the conductive layer. In addition, the number of the light-scattering fine particles per unit area of the conductive layer is 5% or less, preferably 1% or less, and more preferably substantially 0% of the number of the light-scattering fine particles per unit area of the light-scattering layer. Meanwhile, "being substantially 0%" means that inevitably remaining metal nanowires or light-scattering fine particles are permitted.

In addition, the conductive member of the invention can be used to produce, for example, a touch panel, and in this case, the conductive regions and the non-conductive regions are formed in a desired shape.

The invention is capable of forming a pattern in which it is not possible to easily differentiate the conductive layer and the light-scattering layer visually, but the conductive layer and the light-scattering layer can be differentiated using an optical microscope. That is, in a case in which the metal nanowires and the insulating light-scattering fine particles in the light-scattering layer have different shapes, the conductive layer and the light-scattering layer can be differentiated using the difference in the particle shape. In addition, in the case in which the metal nanowires and the insulating light-scattering fine particles have the same or similar shapes, the conductive layer and the light-scattering layer can be differentiated using the fact that fibrous particles are disposed so as not to traverse the boundary between the conductive layer and the light-scattering layer. Human eyes are capable of sensing a unique disposition in the boundary section between two adjacent regions as a sense of difference even in a case in which there is no actual boundary line as described above, and are capable of easily differentiating the conductive layer and the light-scattering layer.

Substrate:

A variety of substrates can be used as the substrate depending on purposes as long as the substrate is capable of bearing the conductive layer and the light-scattering layer. Generally, a plate-shape or sheet-shaped substrate is used.

The substrate may be transparent or opaque. Examples of a material configuring the substrate include transparent glass such as white-plate glass, blue-plate glass, and silica-coated blue-plate glass; synthetic resins such as polycarbonate, polyether sulfone, polyester, acrylic resins, vinyl chloride resins, aromatic polyamide resins, polyamide-imide, polyimide, and cellulose derivatives; metal such as aluminum, copper, nickel, and stainless steel; other ceramics; silicon wafers used for semiconductor substrates; and the like. On the surfaces of the above-described substrates on which the conductive layer is formed, it is possible to carry out as desired a pretreatment such as a cleaning treatment using an alkali aqueous solution, a chemical treatment using a silane coupling agent or the like, a plasma treatment, ion plating, sputtering, a gas-phase reaction method, or vacuum deposition.

The thickness of the substrate is set in a desired range depending on use. Generally, the thickness of the substrate is selected from a range of 1 µm to 500 µm, more preferably from a range of 3 µm to 400 µm, and still more preferably from a range of 5 µm to 300 µm.

In a case in which the conductive member is required to be transparent, the total light transmittance of the substrate is 70% or more, more preferably 85% or more, and still more preferably 90% or more.

In a case in which the conductive member is required to have a low retardation property, the in-plane retardation value Re (550) of the substrate at a wavelength of 550 nm is 100 nm or less, preferably 50 nm or less, and still more preferably 10 nm or less.

Re ($\lambda$) is measured by entering light having a wavelength of $\lambda$ nm in a film normal direction in a KOBRA 21ADH or KOBRA WR (both manufactured by Oji Scientific Instruments). When the measurement wavelength $\lambda$ nm is selected, Re ($\lambda$) can be measured by manually exchanging wavelength-selecting filters or by converting the measured value using a program or the like.

Figure 2:
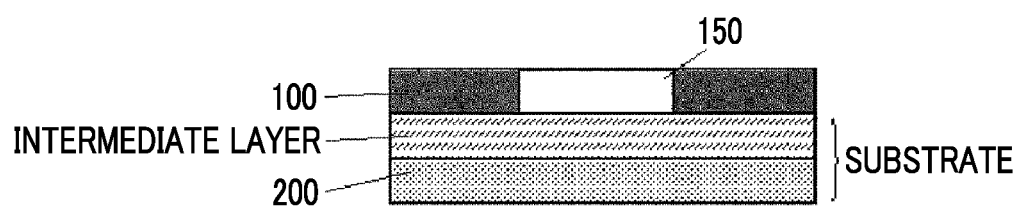
FIG. 2 is a schematic view illustrating another example of the conductive member of the invention.

Intermediate Layer:

As illustrated in the example of FIG. 2, it is preferable to provide at least one intermediate layer between the substrate and the conductive layer or the light-scattering layer (hereinafter, the conductive layer and the light-scattering layer will be collectively referred to as "patterned layers"). When the intermediate layer is provided between the substrate and the patterned layer, it becomes possible to improve at least one of the adhesiveness between the substrate and the patterned layer, the total light transmittance of the patterned layer, the haze of the patterned layer, and the film strength of the patterned layer.

Examples of the intermediate layer include an adhesive layer for improving the adhering force between the substrate and the patterned layer, a functional layer improving functionalities using the interaction between components included in the patterned layer, an antistatic layer; and the like. The intermediate layer is appropriately provided depending on purposes.

Meanwhile, in the invention, the substrate is defined to include all of a supporter and layers adjacent to the conductive layer. For example, in a case in which the supporter and the intermediate layer are provided, and the intermediate layer is adjacent to the patterned layer as illustrated in FIG. 2, the substrate is defined to include the supporter and the intermediate layer.

The material for the supporter is not particularly limited as long as the material is a flexible macromolecule. For example, the material for the supporter can be selected from macromolecular (including both of resins and polymers) films, sheets, and compacts.

Examples of the available macromolecular film and the like include films containing polyethylene terephthalate (PET), polycarbonate, polyether sulfone, polyester, an acryl resin, a vinyl chloride resin, an aromatic polyamide resin, polyamide-imide, polyimide, or fiber-reinforced plastic (FRP) as the main component.

The material that can be used for the intermediate layer is not particularly limited as long as the material improves at least any one of the above-described characteristics.

For example, in a case in which an adhesive layer is provided as the intermediate layer, examples of the material for the intermediate layer include materials selected from sol-gel films and the like obtained by hydrolyzing and polycondensing a polymer used for an adhesive, a silane coupling agent, a titanium coupling agent, and an alkoxide compound of Si.

In addition, the intermediate layer in contact with the patterned layer (that is, the intermediate layer in a case in which a single intermediate layer is provided, and an intermediate layer in contact with the conductive layer in a case in which multiple intermediate layers are provided) is preferably a functional layer containing a compound having a functional group that can interact with the metal nanowires included in the patterned layer since a patterned layer having excellent total light transmittance, haze, and film strength can be obtained. In a case in which the above-described intermediate layer is provided, the patterned layer having an excellent film thickness can be obtained even when the patterned layer includes the metal nanowires and an organic macromolecule.

The above-described action is not clear, but it is considered that, when an intermediate layer containing a compound having a functional group that can interact with the metal nanowires included in the patterned layer is provided, the aggregation of the conductive material in the patterned layer is suppressed by the interaction between the metal nanowires included in the patterned layer and the compound having the above-described functional group included in the intermediate layer, the uniform dispersibility is improved, the degradation of transparency or haze caused by the aggregation of the conductive material in the patterned layer is suppressed, and the film strength is improved due to adhesiveness. The intermediate layer (functional layer) capable of developing the above-described interaction develops the above-described effect from the interaction with the conductive material, and therefore the effect is still developed even when the intermediate layer is provided adjacent not only to the patterned layer having the above-described three-dimensional crosslinking structure but also to the patterned layer including the metal nanowires and the organic macromolecule in the invention.

The above-described functional group that can interact with the metal nanowires is more preferably at least one selected from the group consisting of an amide group, an amino group, a mercapto group, a carboxylic group, a sulfonic acid group, a phosphate group, a phosphonate group, and salts thereof. The functional group is still more preferably an amino group, a mercapto group, a phosphate group, a phosphonate group, and salts thereof, and most preferably an amino group. The functional group exhibits the effect particularly significantly in a case in which the metal nanowires are silver nanowires.

Examples of the above-described compound having a functional group include compounds having an amide group such as ureidopropyl triethoxysilane, polyacrylamide, and polymethacrylamide, compounds having an amino group such as N-β(aminoethyl)γ-aminopropyl trimethoxysilane, 3-aminopropyl triethoxysilane, bis(hexamethylene)triamine, N,N'-bis(3-aminopropyl)-1,4-butadiamines tetrahydrochloride, spermine, diethylene triamine, m-xylene diamine, and methaphenylene diamine; compounds having a mercapto group such as 3-mercapto propyl trimehoxysilane, 2-mercaptobenzothiazole, and toluene-3,4-dithiol; compound having a sulfonic acid or a group of a salt thereof such as poly(p-sodium styrenesulfonate) and poly(2-acrylamide-2-methylpropane sulfonate); compounds having a carboxylic acid such as polyacrylic acid, polymethacrylic acid, polyasparaginic acid, teraphthalic acid, cinnamic acid, fumaric acid, and succinic acid; compounds having a phosphate group such as PHOSMER PE, PHOSMER CL, PHOSMER M, PHOSMER MH, polymers thereof, POLYPHOSMER M-101, POLYPHOSMER PE-201, and POLYPHOSMER MH-301; and compounds having a phosphonate group such as phenyl phosphonate, decyl phosphonate, methylene diphosphoate, vinyl phosphonate, and allyl phosphoate.

When the above-described functional group is selected, the interaction between the metal nanowires and the functional group included in the intermediate layer is caused after the application of the coating fluid for forming the conductive layer, the aggregation of the metal nanowires during drying is suppressed, and it is possible to form a conductive layer in which the metal nanowires are uniformly dispersed.

The intermediate layer can be formed by applying and drying a liquid in which a compound configuring the intermediate layer is dissolved, or dispersed and emulsified on the substrate, and an ordinary method can be used as the coating method. The coating method is not particularly limited, and can be appropriately selected depending on purposes. Examples thereof include a roll coating method, a bar coating method, a dip coating method, a spin coating method, a casting method, a die coating method, a blade coating method, a gravure coating method, a curtain coating method, a spray coating method, a doctor coating method, and the like.

Other Layers (Functional Layers):

The conductive member of the invention may include layers (functional layers) other than the substrate and the patterned layer.

Examples of the functional layer include an insulating film such as an adhering layer, a protective film, a basecoat layer, an adhesion layer, a cushion layer, an overcoat protective layer, a protective film layer, an antifouling layer, a water-repellent layer, an oil-repellent layer, a bar-coated layer, a barrier layer, and the like.

In addition, it is possible to supply optical functions by laminating, for example, an anti-glare layer, an antireflection layer, a low-reflection layer, a λ/4 layer, a polarizing layer, a phase difference layer, and the like. The above-described layers may be solely used, or multiple layers may be laminated.

Since the conductive member according to the invention has favorable conductive properties and high transparency, and does not easily allow the appearance of a pattern and insulation failure caused by electrochemical migration, the conductive member is widely applied to, for example, a polarizing plate, a circularly polarizing plate, a touch panel, an electrode for a display, an electromagnetic shield, an electrode for an organic EL display, an electrode for an inorganic EL display, electronic paper, an electrode for a flexible display, an integrated solar cell, a liquid crystal display apparatus, a touch panel function-equipped display apparatus, and a variety of other devices. Among the above-described components, the application to a touch panel is particularly preferred.

Polarizing Plate and Circularly Polarizing Plate:

There is no particular limitation regarding the polarizing plate and circularly polarizing plate of the invention except for the fact that the polarizing plate and circularly polarizing plate include the conductive material of the invention, and the polarizing plate and circularly polarizing plate can be appropriately selected. The polarizing plate and circularly polarizing plate include the conductive material and a polarizing film, and furthermore include a protective film if necessary. Preferably, the conductive material is laminated on the polarizing film or the protective film.

An ordinary linear polarizing film can be used as the polarizing film. The polarizing film may be formed of a stretched film or may be a layer formed through coating. The former example can be a film obtained by dyeing a stretched film of polyvinyl alcohol using iodine, a dichromatic dye, or the like. The latter example can be a layer fixed in a predetermined orientation state by applying a composition containing a dichromatic liquid crystalline pigment.

As the protective film, it is preferable to use a transparent material having an in-plane retardation value Re (550) at a wavelength of 550 nm of 40 nm or less.

Touch Panel:

The conductive member according to the invention is applied to, for example, a surface capacitive touch panel, a projected capacitive touch panel, a resistive touch panel, and the like. Here, the touch panel includes so-called touch sensors and touch pads.

The layer configuration of a touch panel sensor electrode unit in the touch panel is preferably any one of an attachment type in which two transparent electrodes are attached to each other, a type in which transparent electrodes are equipped on both surfaces of one substrate, and a single-surface jumper type, a through hole type, or a single-surface lamination type.

The surface capacitive touch panel is described in, for example, JP2007-533044T.

There is no particular limitation regarding the display apparatus of the invention except for the fact that the display apparatus includes the conductive material of the invention, and the display apparatus can be appropriately selected depending on purposes.

The liquid crystal display apparatus includes a color filter and a back light, and further includes other members if necessary.

The liquid crystal display apparatus is described in, for example, "Next generation liquid crystal display technologies (edited by Tatsuo Uchida, published by Kogyo Chosakai Publishing Co., Ltd., 1994)". The liquid crystal display apparatus to which the invention can be applied is not particularly limited, and the invention can be applied to, for example, a variety of types of liquid crystal display apparatuses described in the above-described "Next generation liquid crystal display technologies".

There is no particular limitation regarding the liquid crystal used for the liquid crystal display apparatus, that is, the liquid crystal compound and the liquid crystal composition, and any liquid crystal compounds and any liquid crystal compositions can be used.

EXAMPLES

Hereinafter, examples of the invention will be described, but the invention is not limited to the examples. Meanwhile, both "%" and "parts" expressing the contents in the examples are based on the mass.

In the following examples, the average short axis length (average diameter), average long axis length, and average aspect ratio of the metal nanowires, and the variation coefficient of the short axis length were measured as described below.

<The Average Short Axis Length (Average Diameter), Average Long Axis Length, and Average Aspect Ratio of the Metal Nanowires>

The short axis lengths (diameters) and long axis lengths of 300 metal nanowires randomly selected from metal nanowires observed in an enlarged manner using a transmission electron microscope (TEM; manufactured by JEOL Ltd., JEM-2000FX) were measured, and the average short axis length (diameter) and average long axis length of the metal nanowires were obtained from the average values. Furthermore, the value of the average long axis length/the average short axis length was obtained as the average aspect ratio.

<The Variation Coefficient of the Short Axis Length (Diameter) of the Metal Nanowires>

The short axis lengths (diameters) of 300 nanowires randomly selected from the above-described transmission electron microscope (TEM) image were measured, and the standard deviation and average value of the 300 nanowires were calculated, thereby obtaining the variation coefficient of the short axis length (diameter) of the metal nanowires as the quotient of the division of the standard deviation by the average value.

Preparation Example 1

—The Preparation of a Silver Nanowire Dispersion Liquid (1)—

The following addition liquids A, B, C, and D were prepared in advance.

[Addition Liquid A]

120 mg of stearyl trimethyl ammonium chloride, 600 mg of strearyl trimethyl ammonium hydroxide, and 2.0 g of glucose were dissolved in 120.0 g of distilled water, thereby preparing a reaction solution A-1. Furthermore, 70 mg of silver nitrate powder were dissolved in 2.0 g of distilled water, thereby preparing a silver nitrate aqueous solution A-1. The reaction solution A-1 was held at 25° C., and the silver nitrate aqueous solution A-1 was added under fast stirring. The fast stirring was continued over 180 minutes from the addition of the silver nitrate aqueous solution A-1, thereby preparing an addition liquid A.

[Addition Liquid B]

42.0 g of silver nitrate powder was dissolved in 958 g of distilled water.

[Addition Liquid C]

75 g of 25% ammonia water was mixed with 925 g of distilled water

[Addition Liquid D]

400 g of polyvinyl pyrrolidone (K30) was dissolved in 1.6 kg of distilled water.

Next, a silver nanowire dispersion liquid (1) was prepared in the following manner. 1.30 g of stearyl trimethyl ammonium bromide powder, 33.1 g of sodium bromide, 1,000 g of glucose powder, and 115.0 g of nitric acid (1 N) were dissolved in 12.7 kg of distilled water at 80° C. The solution was held at 80° C., and the addition liquids A, B, and C were sequentially added at addition rates of 250 ml/minute, 500 ml/minute, and 500 ml/minute respectively under stirring at 500 rpm. The stirring rate was set to 200 rpm, and the solution was heated at 80° C. Next, heating and stirring were continued over 100 minutes from the setting of the stirring rate to 200 rpm, and then the solution was cooled to 25° C. After that, the stirring rate was changed to 500 rpm, and the addition liquid E was added at 500 ml/minute. The liquid was used as a preliminary liquid 101.

Next, the preliminary liquid 101 was added at once to 1-propanol under fast stirring so that the volume ratio reached one-to-one. The obtained liquid mixture was stirred over three minutes, and was used as a preliminary liquid 102.

Ultrafiltration was carried out in the following manner using an ultrafiltration module having a molecular weight cutoff of 150,000. After the concentration of the preliminary liquid 102 was condensed to four times, the addition and condensation of a solution mixture (volume ratio of one-to-one) of distilled water and 1-propanol were repeated until the conductivity of the filtrate finally reached 50 μS/cm or less. The obtained filtrate was condensed, and a silver nanowire dispersion liquid (1) having a metal content of 0.45% was obtained.

Regarding silver nanowires in the obtained silver nanowire dispersion liquid (1), the average short axis length, the average long axis length, the variation coefficient of the short axis length of the silver nanowires, and the average aspect ratio were measured as described above.

As a result, the average short axis length was 18.6 nm, the average long axis length was 8.2 μm, and the variation coefficient was 15.0%. The average aspect ratio was 440. Hereinafter, the "silver nanowire dispersion liquid (1)" denoted below will refer to the silver nanowire dispersion liquid obtained using the above-described method.

Preparation Example 2

—The Preparation of a Silver Nanowire Dispersion Liquid (2)—

60 g of silver nitrate powder was dissolved in 370 g of propylene glycol, thereby preparing a silver nitrate solution 101. 72.0 g of polyvinyl pyrrolidone (molecular weight of 55,000) was added to 4.45 kg of propylene glycol, and the mixture was heated to 90° C. while ventilating nitrogen gas through a gas-phase section of a container. The liquid was used as a reaction solution 101. While holding the ventilation of the nitrogen gas, 2.50 g of the silver nitrate solution 101 was added to the reaction solution 101 under fast stirring, and heating and stirring was carried out over one minute. Furthermore, the solution was added to a solution obtained by dissolving 11.8 g of tetrabutyl ammonium chloride to 100 g of propylene glycol, thereby preparing a reaction solution 202.

200 g of the silver nitrate solution 101 was added to a reaction solution 202 being held at 90° C. and stirred at a stirring rate of 500 rpm at an addition rate of 50 ml/minute. The stirring rate was dropped to 100 rpm, the ventilation of nitrogen gas was stopped, and heating and stirring was carried out over 15 hours. 220 g of the silver nitrate solution 101 was added to the solution being held at 90° C. and stirred at a stirring rate of 100 rpm at an addition rate of 0.5 ml/minute, and heating and stirring were continued over two hours from the end of the addition. The stirring rate was changed to 500 rpm, 1.0 kg of distilled water was added to the solution, and then the solution was cooled to 25° C., thereby preparing a preliminary liquid 201.

Ultrafiltration was carried out in the following manner using an ultrafiltration module having a molecular weight cutoff of 150,000. The addition and condensation of a solution mixture (volume ratio of one-to-one) of distilled water and 1-propanol to the preliminary liquid 201 were repeated until the conductivity of the filtrate finally reached 50 μS/cm or less. The obtained filtrate was condensed, and a silver nanowire dispersion liquid (2) having a metal content of 0.45% was obtained.

Regarding silver nanowires in the obtained silver nanowire dispersion liquid (2), the average short axis length, the average long axis length, the variation coefficient of the short axis length of the silver nanowires, and the average aspect ratio were measured as described above.

As a result, the average short axis length was 28.5 nm, the average long axis length was 15.2 μm, and the variation coefficient was 18.6%. The average aspect ratio was 533. Hereinafter, the "silver nanowire dispersion liquid (2)" denoted below will refer to the silver nanowire dispersion liquid obtained using the above-described method.

Preparation Example 3

—The Preparation of a Silver Nanowire Dispersion Liquid (3)—

A silver nanowire dispersion liquid (3) having a metal content of 0.45% was obtained in the same manner as in Preparation Example 1 except for the fact that the addition liquid A was not used in Preparation Example 1.

Regarding silver nanowires in the obtained silver nanowire dispersion liquid (3), the average short axis length, the average long axis length, the variation coefficient of the short axis length of the silver nanowires, and the average aspect ratio were measured as described above.

As a result, the average short axis length was 47.2 nm, the average long axis length was 12.6 μm, and the variation coefficient was 23.1%. The average aspect ratio was 267. Hereinafter, the "silver nanowire dispersion liquid (3)" denoted below will refer to the silver nanowire dispersion liquid obtained using the above-described method.

Preparation Example 4

—The Production of a PET Substrate 101—

A solution for adhesion 1 was prepared using the following formulation.

[Solution for Adhesion 1]

| | |
|---|---|
| TAKELAC WS-4000 (polyurethane for coating, solid content concentration 30%, manufactured by Mitsui Chemicals, Inc.) | 5.3 parts |
| Surfactant (NAROACTY HN-100, manufactured by Sanyo Chemical Industries, Ltd.) | 0.25 parts |
| Surfactant (SANDET BL, solid content concentration 43%, manufactured by Sanyo Chemical Industries, Ltd.) | 0.35 parts |
| Water | 94.1 parts |

A corona discharging treatment was carried out on one surface of a 125 μm-thick PET film, the solution for adhesion 1 was applied on the corona-discharging-treated surface, and was dried at 125° C. for 1.5 minutes, thereby forming a 0.11 μm-thick first adhesion layer.

A solution for adhesion 2 was prepared using the following formulation.

[Solution for Adhesion 2]

| | |
|---|---|
| Tetraethoxysilane (KBE-04, manufactured by Shin-Etsu Chemical, Co., Ltd.) | 5.0 parts |
| 3-glycidoxypropyltrimethoxysilane (KBM-403, manufactured by Shin-Etsu Chemical, Co., Ltd.) | 3.1 parts |
| 2-(3,4-epoxycylohexyl)ethyltrimethoxysilane (KBM-303, manufactured by Shin-Etsu Chemical, Co., Ltd.) | 18.1 parts |
| Acetic acid aqueous solution (acetic acid concentration = 0.05%, pH = 5.2) | 10.0 parts |
| Curing agent (boric acid, manufactured by Wako Pure Chemical, Industries, Ltd.) | 0.8 parts |
| Colloidal silica (SNOWTEX O, average particle diameter: 10 nm to 20 nm, solid content concentration: 20%, pH = 2.6, manufactured by Nissan Chemical Industries, Ltd.) | 60.0 parts |
| Surfactant (NAROACTY HN-100, manufactured by Sanyo Chemical Industries, Ltd.) | 0.2 parts |
| Surfactant (SANDET BL, solid content concentration 43%, manufactured by Sanyo Chemical Industries, Ltd.) | 0.2 parts |

The solution for adhesion 2 was prepared using the following method. 3-glycidoxypropyltrimethoxysilane was added dropwise to the acetic acid aqueous solution under fast stirring over three minutes. Next, 2-(3,4-epoxycylohexyl)ethyltrimethoxysilane was added to the acetic acid aqueous solution under fast stirring over three minutes. Next, tetraethoxysilane was added to the acetic acid aqueous solution under fast stirring over five minutes, and then stirring was continued for two hours. Next, the colloidal silica, the curing agent, and the surfactants were sequentially added, thereby preparing a solution for adhesion 2.

After a corona discharging treatment was carried out on a surface of the above-described first adhesion layer, the above-described solution for adhesion 2 was applied to the surface using a bar coating method, was heated and dried at 170° C. for one minute so as to form a 0.5 μm-thick second adhesion layer, thereby obtaining a PET substrate 101.

Preparation Example 5

—The Production of a Glass Substrate 100—

A 0.7 μm-thick non-alkali glass substrate that had been immersed in a 1% aqueous solution of sodium hydroxide was irradiated with an ultrasonic wave for 30 minutes using an ultrasonic washing machine, subsequently, was washed using ion-exchange water for 60 seconds, and then a heating treatment was carried out at 200° C. for 60 minutes. After that, a silane coupling liquid (a 0.3% aqueous solution of N-(β-aminoethyl)-γ-aminopropyl trimethoxysilane, product name: KBM603, manufactured by Shin-Etsu Chemical, Co., Ltd.) was showered over 20 seconds, and the glass substrate was washed by showering with pure water, thereby obtaining a glass substrate 100. Hereinafter, the "glass substrate 100" denoted below will refer to the non-alkali glass substrate obtained by the above-described pretreatment.

Preparation Example 6

—The Production of a Conductive Member (1)—

A sol-gel solution (1) having the following composition was stirred at 60° C. for one hour, and it was checked whether or not the solution became homogeneous. The weight-average molecular weight (Mw) of the obtained sol-gel solution was measured using GPC (in terms of polystyrene), and Mw was found to be 4,400. 2.24 parts of the sol-gel solution and 17.76 parts of the silver nanowire dispersion liquid (1) were mixed, and furthermore, were diluted using distilled water and 1-propanol, thereby obtaining a sol-gel coating fluid. The solvent proportion in the obtained sol-gel coating fluid was 60:40 (the distilled water:1-propanol). After a corona discharging treatment was carried out on a surface of the second adhesion layer in the above-described PET substrate 101, and the above-described sol-gel coating fluid was applied to the surface using a bar coating method so that the silver amount reached 0.015 g/m$^2$, and the entire solid content coating amount reached 0.120 g/m$^2$, the sol-gel coating fluid was dried at 100° C. for one minute so as to cause a sol-gel reaction, thereby forming a conductive layer. Therefore, a conductive member (1) was obtained.

<Sol-Gel Solution (1)>

| | |
|---|---|
| Tetraethoxysilane (KBE-04, manufactured by Shin-Etsu Chemical, Co., Ltd.) | 5.0 parts |
| 1% aqueous solution of acetic acid | 11.0 parts |
| Distilled water | 4.0 parts |

Preparation Example 7

—The Production of a Conductive Member (2)—

A conductive member (2) was obtained in the same manner as in Preparation Example 6 except for the fact that the silver nanowire dispersion liquid (2) was used instead of the silver nanowire dispersion liquid (1) in Preparation Example 6.

Preparation Example 8

—The Production of a Conductive Member (3)—

A conductive member (3) was obtained in the same manner as in Preparation Example 6 except for the fact that the silver nanowire dispersion liquid (3) was used instead of the silver nanowire dispersion liquid (1) in Preparation Example 6.

Preparation Example 9

—The Production of a Conductive Member (4)—

The silver nanowire dispersion liquid (1) and hydroxyethyl cellulose were mixed so that the mass ratio (silver nanowires/hydroxyethyl cellulose) reached 1/1, thereby preparing a conductive composition (4). A corona discharging treatment was carried out on a surface of a 125 μm-thick PET film, and the conductive composition (4) was applied to the surface using a bar coater so that the silver amount reached 0.015 g/m$^2$, and was dried at 100° C. for two minutes, thereby obtaining a conductive member (4).

Preparation Example 10

—The Production of a Patterning Conductive Member (P-1)—

<The Preparation of a Photosensitive Composition (1)>

Methacrylic acid (MAA) (7.8 g) and benzyl methacrylate (BzMA) (37.2 g) were used as monomer components configuring a copolymer, azobisisobutyronitrile (AIBN, 0.5 g) was used as a radical polymerization initiator, and a polymerization reaction of the above-described components was caused in a solvent PGMEA (55.0 g), thereby obtaining a PGMEA solution (solid content concentration: 45 mass %) of a binder (A-1). Meanwhile, the polymerization temperature was adjusted to 100° C. from 60° C.

As a result of measuring the molecular weights using a gel permeation chromatography (GPC) method, the weight-average molecular weight (Mw) in terms of polystyrene was 30,000, and the molecular weight distribution (Mw/Mn) was 2.21.

4.2 parts of the binder (A-1) (solid content: 40.0 mass %, PGMEA solution), 0.95 parts of TAS-200 (esterification rate: 66%, manufactured by Toyo Gosei Co., Ltd.) as a photosensitive compound, 0.80 parts of EHPE-3150 (manufactured by Daicel Corporation) as a crosslinking agent, and 19.0 parts of PGMEA were added and stirred, thereby preparing a photosensitive composition (1).

<<Resist Patterning>>

The photosensitive composition (1) was applied on the conductive member (1) using a bar coating method so that the dried film thickness reached 5 μm, and was dried in an oven at 100° C. for one minute. An i-ray (365 nm) from a high-pressure mercury lamp was radiated to the substrate from above an exposure mask (photomask) at an intensity of 60 mJ/cm$^2$ (illuminance of 20 mW/cm$^2$), thereby carrying out exposure. Shower development of the exposed substrate was carried out using an aqueous solution of 2.41% tetramethylammonium hydroxide for 60 seconds. The shower pressure was 0.04 Mpa, and the time taken until the stripe pattern appeared was 30 seconds. The substrate was rinsed through pure water shower, and then dried at 50° C. for one minute, thereby producing a patterning resist-attached conductive member (1). In addition, in the exposure mask, the line/space was set to 100/100 μm, and the fine line length was set to 1.5 cm.

<<Etching>>

The patterning resist-attached conductive member (1) was immersed in a mixed aqueous solution of 1.0% nitric acid, 1.0% Fe(III)-EDTA, and 1.0% ammonium thiosulfate at 30° C., etched, rinsed through pure water shower, and then was dried at 50° C. for one minute, thereby producing a resist-attached patterning conductive member (1).

<<The Formation of a Light-Scattering Layer>>

The below-described sol-gel solution (2) and a silica fine particle-dispersed substance (SEAHOSTAR KE-W50, manufactured by Nippon Shokubai Co., Ltd., average particle diameter: 0.45 µm to 0.55 µm, solid content concentration: 20%) were mixed so that the mass ratio between tetraethoxysilane (TEOS) and $SiO_2$ (derived from the fine particle-dispersed substance) reached 7:1, the obtained liquid mixture was applied onto the resist-attached patterning conductive member (1) through bar coating so that the silica fine particle amount reached 1 mg/m$^2$, and was dried at 120° C. for three minutes. Furthermore, an i-ray (365 nm) from a high-pressure mercury lamp was radiated with no exposure mask at an intensity of 100 mJ/cm$^2$ (illuminance of 20 mW/cm$^2$), thereby carrying out exposure. Shower development of the exposed substrate was carried out using an aqueous solution of 2.40% tetramethylammonium hydroxide for 75 seconds. The shower pressure was 0.05 Mpa. The substrate was rinsed through pure water shower, and then dried at 50° C. for one minute, thereby producing a patterning conductive member (P-1).

<Sol-Gel Solution (2)>

After a sol-gel solution (2) having the following composition was stirred at 60° C. for one hour, it was checked whether or not the solution became homogeneous, and the sol-gel solution (2) was produced.

| | |
|---|---|
| Tetraethoxysilane (KBE-04, manufactured by Shin-Etsu Chemical, Co , Ltd.) | 5.1 parts |
| 1% aqueous solution of acetic acid | 10.5 parts |
| Distilled water | 4.4 parts |

Preparation Example 11

—The Production of a Patterning Conductive Member (P-2)—

A patterning conductive member (P-2) was produced in the same manner as in Preparation Example 10 except for the fact that titanium oxide fine particles (FTL-300, manufactured by Ishihara Sangyo Kaisha, Ltd., average short axis length: 0.27 µm, average long axis length: 5.15 µm) were used instead of the silica fine particles in Preparation Example 10.

Preparation Example 12

—The Production of a Patterning Conductive Member (P-3)—

A patterning conductive member (P-3) was produced in the same manner as in Preparation Example 10 except for the fact that zirconium oxide fine particles (ZR-30AL, manufactured by Nissan Chemical Industries, Ltd., average particle diameter: 0.07 µm to 0.11 µm) were used instead of the silica fine particles in Preparation Example 10.

Preparation Example 13

—The Production of a Patterning Conductive Member (P-4)—

A patterning conductive member (P-4) was produced in the same manner as in Preparation Example 10 except for the fact that alumina fine particles (A33F, manufactured by Nippon Light Metal Company, Ltd., average particle diameter: 0.7 µm) were used instead of the silica fine particles in Preparation Example 10.

Preparation Example 14

—The Production of a Patterning Conductive Member (P-5)—

A patterning conductive member (P-5) was produced in the same manner as in Preparation Example 10 except for the fact that the conductive member (2) was used instead of the conductive member (1) in Preparation Example 10.

Preparation Example 15

—The Production of a Patterning Conductive Member (P-6)—

A patterning conductive member (P-6) was produced in the same manner as in Preparation Example 10 except for the fact that the conductive member (3) was used instead of the conductive member (1) in Preparation Example 10.

Preparation Example 16

—The Production of a Patterning Conductive Member (P-C1) and a Patterning Conductive Member (P-7)—

<<Patterning>>

A patterning treatment was carried out using the conductive member (1) and the following method. A vacuum-type printing table (WHT-3) and SQUEEGEE No. 4 YELLOW manufactured by Mino Group Co., Ltd. were used for screen printing. Regarding a solution of silver nanowires for forming a pattern, a developing agent CP-48S-A, a developing agent CP-48S-B (both manufactured by FujiFilm Corporation), and pure water were mixed at 1:1:1, and the viscosity of the mixture was increased by adding hydroxyethyl cellulose, thereby preparing an ink for screen printing. A pattern mesh having a slide pattern (line/space=100 µm/100 µm) was used. After the pattern was printed, the pattern was left to stand for 15 seconds, and was rinsed using pure water (shower pressure 0.04 MPa). Water droplets were scattered using an air spray, and the pattern was dried at 50° C. for one minute. The obtained film was used as a patterning conductive member (P-C1).

<<The Formation of a Light-Scattering Layer>>

A mixture obtained by mixing the below-described sol-gel solution (3) and a silica fine particle-dispersed substance (SEAHOSTAR KE-W50, manufactured by Nippon Shokubai Co., Ltd., average particle diameter: 0.45 µm to 0.55 µm, solid content concentration: 20%) so that the mass ratio between tetraethoxysilane (TEOS) and $SiO_2$ (derived from the fine particle-dispersed substance) reached 7:1 was used as an ink for screen printing, and a pattern was printed on a non-conductive layer (a layer obtained by dissolving and removing the silver nanowires in the conductive layer) in the patterning conductive member (P-C1) using the same apparatus and pattern mesh as those for the above-described patterning step so that the fine particle amount reached 1 mg/m$^2$. The patterning conductive member was dried at 120° C. for three minutes, and was used as a patterning conductive member (P-7).

<Sol-Gel Solution (3)>

A sol-gel solution (3) having the following composition was stirred at 60° C. for six hours, it was checked whether or not the solution became homogeneous, and the solution was used as the sol-gel solution (3).

| | |
|---|---|
| Tetraethoxysilane (KBE-04, manufactured by Shin-Etsu Chemical, Co., Ltd.) | 5.1 parts |
| 1% aqueous solution of acetic acid | 10.5 parts |
| Distilled water | 4.4 parts |

Preparation Example 17

—The Production of a Patterning Conductive Member (P-8)—

A patterning conductive member (P-8) was obtained by carrying out the patterning and the formation of a light-scattering layer in the same manner as in Preparation Example 16 except for the fact that the conductive member (4) was used instead of the conductive member (1) in Preparation Example 16.

Preparation Example 18

—The Production of a Patterning Conductive Member (P-9)—

<<The Production of a Silver Nanowire PGME Dispersion Liquid>>

After the centrifugal separation of the silver nanowire dispersion liquid (1), supernatants were removed through decantation, propylene glycol monomethyl ether (PGME) was added so as to disperse the components again, and the above-described operation was repeated three times, thereby obtaining a silver nanowire PGME dispersion liquid (1) having a metal content of 2.0%.

<<The Production of a Photosensitive Composition (2)>>

167 g of methanol, 333 g of ethyl acetate, 20.0 g of methacrylic acid, 130 g of benzyl methacrylate, 30.0 g of KAYARAD TC-110S (manufactured by Nippon Kayaku Co., Ltd.), 20.0 g of 2-hydroxyethylmethacrylate, 1.0 g of azobisisobutyronitrile, and 3.0 g of thioglycolic acid were mixed, stirred, and polymerized at 65° C. for six hours. 3,000 g of cyclohexane was added to the polymerized solution, a polymer was precipitated, supernatants were removed through decantation, and then the polymer was dried in a vacuum at 40° C. for 20 hours, thereby synthesizing 138 g of the polymer.

The obtained polymer was a random copolymer made up of 23 mol % of methacrylic acid, 56 mol % of benzylmethacrylate, 8 mol % of KAYARAD TC-110S, and 13 mol % of 2-hydroxyethylmethacrylate.

The weight-average molecular weight of the obtained polymer in terms of polyethylene oxide measured using N,N-dimethylformamide (DMF) as a solvent and gel permeation chromatography (GPC) was 7,000.

Next, 0.46 g of the above-described polymer, 0.46 g of M-400 (manufactured by Toagosei Co., Ltd.), 0.046 g of 4,4'-bis(diethylamino)benzophenone, 0.182 g of a 25% toluene solution of 3,4,4'-tri(t-butyl peroxy carbonyl)benzophenone, and 2.0 mg of BYK-300 (manufactured by BYK Japan KK) were added to 3.30 g of propylene glycol monomethyl ether acetate, the components were mixed and stirred, thereby preparing a polymer solution.

20.0 g of the silver nanowire PGME dispersion liquid (1) was slowly added dropwise while stirring the polymer solution, thereby preparing a photosensitive composition (2).

<<The production of a patterning conductive member (P-9P)>>

The photosensitive composition (2) was slit-applied to the glass substrate 100, and was dried for two minutes on a 90° C. hot plate, thereby being prebaked. An i-ray (365 nm) from a high-pressure mercury lamp was radiated to the glass substrate from above an exposure mask (stripe pattern:line/space=100 μm/100 μm) at an intensity of 100 mJ/cm$^2$ (illuminance of 20 mW/cm$^2$), thereby carrying out exposure. Shower development of the exposed glass substrate was carried out using a developing solution obtained by dissolving 5.0 g of sodium hydrogen carbonate and 2.5 g of sodium carbonate in 5,000 g of pure water for 30 seconds. The shower pressure was 0.04 Mpa and the time taken until the stripe pattern appeared was 15 seconds. The substrate was rinsed through pure water shower, and then post-baked at 200° C. for ten minutes, thereby producing a patterning conductive member (P-9P).

<<The Formation of a Light-Scattering Layer>>

A photosensitive composition (3) was produced in the same manner as in the production of the photosensitive composition (2) except for the fact that a 1.0% PGME dispersion liquid of titanium oxide fine particles (FTL-300, manufactured by Ishihara Sangyo Kaisha, Ltd., average short axis length: 0.27 μm, average long axis length: 5.15 μm) was used instead of the silver nanowire PGME dispersion liquid (1) in the production of the photosensitive composition (2).

Furthermore, the photosensitive composition (3) was slit-applied to a surface of the patterning conductive member (P-9P) provided with the conductive layer, and was dried for two minutes on a 90° C. hot plate, thereby being prebaked. An exposure mask obtained by negatively inversing the mask used for the production of the patterning conductive member (P-9P) was set in a location in which the conductive section (exposure section) of the patterning conductive member (P-9P) was not exposed, and an i-ray (365 nm) from a high-pressure mercury lamp was radiated to the substrate at an intensity of 100 mJ/cm$^2$ (illuminance of 20 mW/cm$^2$), thereby carrying out exposure. After exposure, shower development was carried out using a developing solution obtained by dissolving 5.0 g of sodium hydrogen carbonate and 2.5 g of sodium carbonate in 5,000 g of pure water for 30 seconds (the shower pressure was 0.04 MPa). The substrate was rinsed through pure water shower, and then post-based at 200° C. for ten minutes, thereby producing a patterning conductive member (P-9).

Preparation Example 19

—The Production of a Patterning Conductive Member (P-C2)—

A patterning conductive member (P-C2) was obtained in the same manner as in Preparation Example 10 except for the facts that the below-described <<etching 2>> step was carried out instead of the <<etching>> step, and the below-described <<development>> step was carried out instead of the <<the formation of a light-scattering layer>> step in the production of the patterning conductive member (P-1) Preparation Example 10.

<<Etching 2>>

The patterning resist-attached conductive member (1) was immersed in a solution mixture made up of 10 parts of distilled water, 3.1 parts of 37% hydrochloric acid, and 4.1 parts of copper (II) chloride dihydrate, partial etching was carried out, the conductive member was rinsed through pure water shower, and dried at 50° C. for one minute, thereby producing a resist-attached patterning conductive member (P-C2).

<<Development>>

An i-ray (365 nm) from a high-pressure mercury lamp was radiated to the resist-attached patterning conductive member (P-C2) with no mask at an intensity of 100 mJ/cm$^2$ (illuminance of 20 mW/cm$^2$), thereby carrying out exposure.

Shower development of the exposed substrate was carried out using an aqueous solution of 2.40% tetramethylammonium hydroxide for 75 seconds. The shower pressure was 0.05 Mpa. The substrate was rinsed through pure water shower, and then dried at 50° C. for one minute, thereby producing a patterning conductive member (P-C2).

Preparation Example 20

—The Production of a Patterning Conductive Member (P-C3)—

A 250 µm-thick PET film provided with a stripe pattern (opening/non opening=100 µm/100 µm) was closely attached to the surface of the conductive member (1) provided with the conductive layer, and a corona treatment (output: 150 W, electrode distance: 1 mm, scan: 4 m/minute×once) was carried out using a corona surface reformation-evaluating apparatus (manufactured by Kasuga Electric Works Ltd., TEC-4AX). The closely-attached PET base was peeled off, and a patterning conductive member (P-C3) was obtained.

Preparation Example 21

—The Production of a Patterning Conductive Member (P-10)—

A patterning conductive member P-10 was produced in the same manner as in Preparation Example 18 except for the facts that a 1.0% PGME dispersion liquid of titanium oxide fine particles (FTL-300, manufactured by Ishihara Sangyo Kaisha, Ltd., average short axis length: 0.27 µm, average long axis length: 5.15 µm) was used instead of the silver nanowire PGME dispersion liquid (1) in the photosensitive composition (2) used for the production of the patterning conductive member (P-9P), and the silver nanowire PGME dispersion liquid (1) was used instead of a 1.0% PGME dispersion liquid of titanium oxide fine particles (FTL-300, manufactured by Ishihara Sangyo Kaisha, Ltd., average short axis length: 0.27 µm, average long axis length: 5.15 µm) in the photosensitive composition (3) used for the formation of the light-scattering layer in Preparation Example 18.

Preparation Example 22

—The Production of a Patterning Conductive Member (P-11)—

A conductive member (11) was produced in the same manner as in Preparation Example 6 except for the fact that, in addition to 2.24 parts of the sol-gel solution and 17.76 parts of the silver nanowire dispersion liquid (1), 0.0014 parts of a silica fine particle-dispersed substance (SEAHOSTAR KE-W50, manufactured by Nippon Shokubai Co., Ltd., average particle diameter: 0.45 µm to 0.55 µm, solid content concentration: 20%) was added in the method for producing the conductive member (1) in Preparation Example 6. The conductive member (11) contained silver in an amount of 15 mg/m$^2$ and silica fine particles in an amount of 0.055 mg/m$^2$. Meanwhile, the content of the silica fine particles was computed using a formula of (the average volume of the fine particles (0.125 µm$^3$))×(the specific weight of the fine particles (2.2 g/cm$^3$))×(the number per unit area) after counting the number of the silica fine particles per unit area using an optical microscope.

Furthermore, a patterning conductive member (P-11) was produced in the same manner as in Preparation Example 10 except for the fact that the above-described conductive member (11) was used instead of the conductive member (1) in the production of the patterning conductive member (P-1) of Preparation Example 10.

The light-scattering layer in the patterning conductive member (P-11) contained 1.0 mg/m$^2$ of silica fine particles, and 5.5% of the light-scattering fine particles were contained in the conductive layer with respect to the light-scattering fine particles in the light-scattering layer.

The configurations of the produced patterning conductive members are described in the following table. Meanwhile, the content proportion of the metal nanowires in the light-scattering layer was measured in the following manner.

Out of the light-scattering layer observed in an enlarge manner, a total of 40,000 µm$^2$ or more was observed using a scanning electron microscope (SEM; manufactured by JEOL, Ltd., JSM-6500F) from five or more randomly selected regions in a 10 cm×10 cm or larger sample, and the number of the metal nanowires having an aspect ratio of 5 or more was counted, thereby obtaining the average number per area. Furthermore, the average number per unit area of the metal nanowires in the conductive layer was obtained, and the content proportion ((the number per unit area of the metal nanowires in the light-scattering layer)/(the number per unit area of the metal nanowires in the conductive layer)) of the metal nanowires in the light-scattering layer was obtained from the ratio.

In addition, similarly, the content proportion of the light-scattering fine particles in the conductive layer was measured in the following manner.

Out of the light-scattering layer observed in an enlarge manner, a total of 40,000 m$^2$ or more was observed using a scanning electron microscope (SEM; manufactured by JEOL, Ltd., JSM-6500F) from five or more randomly selected regions in a 10 cm×10 cm or larger sample, and the number of the light-scattering fine particles was counted, thereby obtaining the average number per area. Furthermore, the average number per unit area of the light-scattering fine particles in the light-scattering layer was obtained in the same manner, and the content proportion ((the number per unit area of the light-scattering fine particles in the conductive layer)/(the number per unit area of the light-scattering fine particles in the light-scattering layer)) of the light-scattering fine particles in the conductive layer was obtained from the ratio.

Furthermore, regarding the thicknesses of the conductive layers and the light-scattering layers (or the non-conductive layers) in the patterning conductive members produced in the embodiments, five views were photographed using a confocal scanning laser microscope (VK-8510 manufactured by Keyence Corporation) under conditions of a high-direction dissolution of 0.01 µm and a measurement area of approximately 300 µm×200 µm, and the average thickness of the conductive layers or the light-scattering layers (or the non-conductive layers) were measured. Meanwhile, while regions in which conductive particles or light-scattering particles were present protruded compared with regions in which the particles were not present, and there was a case in which the former regions had a greater thickness than the latter regions, the average thickness was measured including the thicknesses of the above-described particles. As a result, (the thickness of the conductive layer, the thickness of the light-scattering layer) were (13 nm, 20 nm) in P-1, (13 nm, 21 nm) in P-2, (13 nm, 18 nm) in P-3, (13 nm, 23 nm) in P-4, (14 nm, 20 nm) in P-5, (17 nm, 20 nm) in P-6, (13 nm, 21 nm) in P-7, (13 nm, 20 nm) in P-8, (13 nm, 20 nm) in P-9, (13 nm, 20 nm) in P-10, (13 nm, 20 nm) in P-11, (13 nm, 8 nm) in PC-1, (13 nm, 0 nm) in PC-2, and (13 nm, 13 nm) in PC-3.

TABLE 1

| Patterning conductive member | Wire short axis length [nm] | Wire long axis length [μm] | Matrix type in conductive layer | Matrix type in light-scattering layer | Patterning method | Light-scattering fine particles | Content proportion of nanowires in light-scattering layer [%] | Content proportion of light-scattering fine particles in conductive layer [%] | Note |
|---|---|---|---|---|---|---|---|---|---|
| P-1 | 18.6 | 8.2 | Sol-gel | Sol-gel | Etching mask/development | $SiO_2$ | 0 | 0 | Invention |
| P-2 | 18.6 | 8.2 | Sol-gel | Sol-gel | Etching mask/development | $TiO_2$ | 0 | 0 | Invention |
| P-3 | 18.6 | 8.2 | Sol-gel | Sol-gel | Etching mask/development | $ZrO_2$ | 0 | 0 | Invention |
| P-4 | 18.6 | 8.2 | Sol-gel | Sol-gel | Etching mask/development | $Al_2O_3$ | 0 | 0 | Invention |
| P-5 | 28.5 | 15.2 | Sol-gel | Sol-gel | Etching mask/development | $SiO_2$ | 0 | 0 | Invention |
| P-6 | 47.2 | 12.6 | Sol-gel | Sol-gel | Etching mask/development | $SiO_2$ | 0 | 0 | Invention |
| P-7 | 18.6 | 8.2 | Sol-gel | Sol-gel | Etching ink printing | $SiO_2$ | 0 | 0 | Invention |
| P-8 | 18.6 | 8.2 | Non-photosensitive polymer | Sol-gel | Etching ink printing | $SiO_2$ | 0 | 0 | Invention |
| P-9 | 18.6 | 8.2 | Negative resist | Positive resist | Resist exposure/development | $TiO_2$ | 0 | 0 | Invention |
| P-10 | 18.6 | 8.2 | Negative resist | Positive resist | Resist exposure/development | $TiO_2$ | 0 | 0 | Invention |
| P-11 | 18.6 | 8.2 | Sol-gel | Sol-gel | Etching mask/development | $SiO_2$ | 0 | 5.5 | Invention |
| P-C1 | 18.6 | 8.2 | Sol-gel | Sol-gel | Etching ink printing | None | 0 | 0 | Comparative Example |
| P-C2 | 18.6 | 8.2 | Sol-gel | Sol-gel | Etching mask/partial etching | Silver nanowires | 254 | 0 | Comparative Example |
| P-C3 | 18.6 | 8.2 | Sol-gel | Sol-gel | Etching mask/corona forcible oxidation | Silver nanowires | 100 | 0 | Comparative Example |

<<Evaluation>>

Regarding each of the obtained conductive members, the surface resistance, the optical characteristics (total light transmittance and haze), the pattern shape visibility, and the migration resistance were evaluated.

<Surface Resistance Value>

The surface resistance of the conductive region in the conductive layer was measured using a Loresta-GP MCP-T600 manufactured by Mitsubish chemical Corporation. The resistance values were measured at the central sections of five conductive regions randomly selected from a 10 cm×10 cm sample, and the average value was obtained.

<Optical Characteristics (Total Light Transmittance)>

The total light transmittance was measured at a measurement angle of 0° using a HAZE GARD PLUS manufactured by BYK-Gardner GmbH with respect to the CIE luminosity function y under an illuminant C. The average value of five randomly-selected positions in a 10 cm×10 cm sample was employed as the total light transmittance.

<Optical Characteristics (Haze)>

The haze was measured using a HAZE GARD PLUS manufactured by BYK-Gardner GmbH. Regarding the measurement, first, a photomask having the same pattern as the stripe pattern of the patterning conductive member was measured as a blank. Next, any one of the conductive layer and the light-scattering layer was overlaid and closely attached to the photomask so as to be shielded, and the haze was measured in the above-described state. The photomask was aligned using an optical microscope. The average value from ten-time measurements was employed as the haze of the conductive layer region or the light-scattering layer region.

<Pattern Shape Visibility>

The patterning conductive member was placed on black paper so that the longitudinal direction of the stripe became perpendicular to the visual line, and the pattern visibility seen at an inclined angle of 45° with respect to the surface of the patterning conductive member was evaluated using the following criteria.

[Evaluation Criteria]

3: The conduction pattern is rarely visible.

2: The presence of the conduction pattern is recognizable.

1: The presence of the conduction pattern is clearly recognized.

<Migration Resistance>

For the patterning conductive member, a voltage of direct current 3 V was continuously applied between adjacent electrodes under an environment of 40° C./70% RH (relative humidity) for 24 hours, the resistance value before the voltage application was considered as R0, the resistance value after the voltage application was considered as R, and ranks were assigned based on the following criteria. Meanwhile, a greater ranking number indicates that the performance is more favorable, and Ranking 3 or higher are levels with no practical problems.

[Evaluation Criteria]

5: R/R0 is in a range of 0.9 to 1.1.

4: R/R0 is in a range of more than 1.1 to 1.2 or in a range of 0.8 to less than 0.9.

3: R/R0 is in a range of more than 1.2 to 1.3 or in a range of 0.7 to less than 0.8.

2: R/R0 is in a range of more than 1.3 to 1.5 or in a range of 0.6 to less than 0.7.

1: R/R0 is 1.5 or more and less than 0.6.

TABLE 2

| Patterning conductive member | Total light transmittance [%] | Conductive layer haze [%] | Light-scattering layer haze [%] | Haze ratio | Pattern shape visibility | Migration resistance |
|---|---|---|---|---|---|---|
| P-1 | 92 | 1.11 | 1.08 | 0.97 | 3 | 4 |
| P-2 | 92 | 0.98 | 1.21 | 1.23 | 2 | 4 |
| P-3 | 94 | 0.98 | 1.09 | 1.11 | 3 | 4 |
| P-4 | 93 | 1.00 | 1.10 | 1.10 | 3 | 4 |
| P-5 | 93 | 1.02 | 1.05 | 1.03 | 3 | 5 |
| P-6 | 93 | 1.01 | 1.11 | 1.10 | 3 | 5 |
| P-7 | 92 | 1.10 | 1.14 | 1.04 | 3 | 4 |
| P-8 | 94 | 1.00 | 1.13 | 1.13 | 3 | 3 |
| P-9 | 94 | 1.05 | 1.26 | 1.20 | 2 | 3 |
| P-10 | 94 | 1.04 | 1.21 | 1.16 | 2 | 3 |
| P-11 | 92 | 1.24 | 1.07 | 0.86 | 2 | 4 |
| P-C1 | 94 | 1.05 | 0.40 | 0.38 | 1 | 4 |
| P-C2 | 93 | 1.02 | 1.03 | 1.01 | 3 | 1 |
| P-C3 | 92 | 1.05 | 1.07 | 1.02 | 3 | 2 |

From the tables, it is found that, in the examples including the conductive layer including the metal nanowires and the light-scattering layer including insulating light-scattering fine particles, the ratio of the haze value between the conductive layer and the light-scattering layer is small, and migration does not easily occur. In addition, from the comparison between P-1 and P-2 in the tables, it is found that, in the examples in which the number of the metal nanowires in the light-scattering layer is 5% or less of the number of the metal nanowires per unit area in the conductive layer, and the number of the light-scattering fine particles per unit area in the conductive layer is 5% or less of the number of the light-scattering fine particles per unit area in the light-scattering layer, the difference in the haze value is smaller, and the appearance of the pattern is difficult.

On the other hand, it is found that, in the comparative examples, at least any one of the ratio of the haze value between the conductive layer and the light-scattering layer and the migration is poor compared with the examples.

—Production of the Touch Panel—

A patterning treatment was carried out using the conductive member (1) and the following method. A vacuum-type printing table (WHT-3) and SQUEEGEE No. 4 YELLOW manufactured by Mino Group Co., Ltd. were used for screen printing. Regarding a solution of silver nanowires for forming a pattern, a developing agent CP-48S-A, a developing agent CP-48S-B (both manufactured by FujiFilm Corporation), and pure water were mixed at 1:1:1, and the viscosity of the mixture was increased by adding hydroxyethyl cellulose, thereby preparing an ink for screen printing. A pattern was printed on the conductive member (1) using a mesh pattern for screen printing and the ink for screen printing. After the pattern was printed, the pattern was left to stand for 15 seconds, and was rinsed using pure water (shower pressure 0.04 MPa). Water droplets were scattered using an air spray, and the pattern was dried at 50° C. for one minute. A touch panel was produced using the obtained patterned conductive member (1) and the method described in "Advanced Touch Panel Technologies" (published on Jul. 6, 2009 by Techno times Co., Ltd.), "Technology and Development of Touch Panel" edited by Yuji Mitani, published by CMC Publishing Co., Ltd. (December, 2004), "FPD International 2009 Forum T-11 Lecture Textbook", "Cypress Semiconductor Corporation Application Note AN2292", and the like. Meanwhile, the pattern shape of the mesh pattern for screen printing also followed the above-described references used for the production of the touch panel.

It was found that, in a case in which the produced touch panel was used, it was possible to produce a touch panel in which the conductive layer and the non-conductive layer were not differentiated due to the low haze, and the responsiveness was excellent with respect to the input of letters and the like or the screen operation by at least one of a bare hand, a gloved hand, and a stylus due to the low resistance.

What is claimed is:

1. A method for manufacturing a conductive member, comprising:
    forming a conductive layer including metal nanowires on a substrate in a pattern shape, and then
    forming a light-scattering layer including insulating light-scattering fine particles on a space of the substrate wherein the conductive layer is not formed; or
    forming a light-scattering layer including insulating light-scattering fine particles on a substrate in a pattern shape, and then
    forming a conductive layer including metal nanowires on a space of the substrate wherein the light-scattering layer is not formed,
    wherein a ratio of haze between the conductive layer and the light-scattering layer calculated by dividing a haze of the light-scattering layer by a haze of the conductive layer is in a range of 0.7 to 1.3.

2. The method for manufacturing a conductive member according to claim 1,
    wherein the conductive layer and the light-scattering layer include a matrix obtained by hydrolyzing and polycondensing a compound represented by the following general formula (II), $$M^1(OR^1)_a R^2_{4-a} \tag{II}$$

in the general formula (II), $M^1$ represents an element selected from Si, Ti, and Zr, each of $R^1$ and $R^2$ individually represents a hydrogen atom or a hydrocarbon group, and a represents an integer of 2 to 4.

3. The method for manufacturing a conductive member according to claim 1,
    wherein an average short axis length of the metal nanowires is 150 nm or less.

4. The method for manufacturing a conductive member according to claim 1,
    wherein an average long axis length of the metal nanowires is in a range of 1 μm to 40 μm.

5. The method for manufacturing a conductive member according to claim 1,
    wherein a content of the metal nanowires configuring the conductive layer is in a range of 1.0 mg/m² to 150.0 mg/m² in the conductive layer.

6. The method for manufacturing a conductive member according to claim 1,
    wherein the metal nanowires comprise silver.

7. The method for manufacturing a conductive member according to claim 1,
    wherein a difference in thickness between the conductive layer and the light-scattering layer is 500% or less of a thickness of the thinner layer of the conductive layer or the light-scattering layer.

8. The method for manufacturing a conductive member according to claim 1,
    wherein forming the conductive layer including metal nanowires on the substrate in the pattern shape or forming the light-scattering layer including insulating light-scattering fine particles on the substrate in the pattern shape is respectively achieved by applying an etching mask in the pattern shape onto the conductive layer or the light-scattering layer, and applying a liquid capable of dissolving the conductive layer or the light-scattering layer to an opening of the etching mask.

9. The method for manufacturing a conductive member according to claim 8, further comprising;
    forming the light-scattering or the conductive layer in the opening of the etching mask after applying the liquid capable of dissolving the conductive layer or the light-scattering layer, and
    peeling the etching mask off.

10. The method for manufacturing a conductive member according to claim 1,
    wherein forming the conductive layer including metal nanowires on the substrate in the pattern shape or forming the light-scattering layer including insulating light-scattering fine particles on the substrate in the patter shape is respectively achieved by printing a photoresist in the pattern shape on the conductive layer or the light-scattering layer, and applying a liquid capable of dissolving the conductive layer or the light-scattering layer to an opening of the photoresist.

11. The method for manufacturing a conductive member according to claim 1,
    wherein forming the conductive layer including metal nanowires on the substrate in the pattern shape or forming the light-scattering layer including insulating light-scattering fine particles on the substrate in the pattern shape is respectively achieved by printing the conductive layer or the light-scattering layer in the pattern shape.

12. The method for manufacturing a conductive member according to claim 1,
    wherein forming the conductive layer including metal nanowires on the substrate in the pattern shape or forming the light-scattering layer including insulating light-scattering fine particles on the substrate in the pattern shape is respectively achieved by pattern-exposing and developing the conductive layer or the light-scattering layer.

13. The method for manufacturing a conductive member according to claim 1,
    wherein forming the conductive layer including the metal nanowires on the substrate in the pattern shape, and then forming the light-scattering layer including the insulating light-scattering fine particles on the space of the substrate wherein the conductive layer is not formed.

14. The method for manufacturing a conductive member according to claim 1,
    wherein forming the light-scattering layer including the insulating light-scattering fine particles on the substrate in the pattern shape, and then
    forming the conductive layer including the metal nanowires on the space of the substrate wherein the light-scattering layer is not formed.

15. A conductive member comprising:
    a substrate;
    a conductive layer including metal nanowires; and
    a light-scattering layer including at least insulating light-scattering fine particles,
    wherein the number of the metal nanowires per unit area of the light-scattering layer is 5% or less with respect to the number of the metal nanowires per unit area of the conductive layer, and
    the number of the insulating light-scattering fine particles per unit area of the conductive layer is 5% or less with respect to the number of the insulating light-scattering fine particles per unit area of the light-scattering layer.

16. The conductive member according to claim 15,
    wherein a ratio of haze between the conductive layer and the light-scattering layer calculated by dividing a haze of the light-scattering layer by a haze of the conductive layer is 0.7 to 1.3.

17. A polarizing plate comprising:
    the conductive member according to claim 15.

18. A display apparatus comprising:
    the polarizing plate according to claim 17.

19. A circularly polarizing plate comprising:
    the conductive member according to claim 15.

20. A display apparatus comprising:
    the circularly polarizing plate according to claim 19.

21. A display apparatus comprising:
    the conductive member according to claim 15.

22. A touch panel comprising:
    the conductive member according to claim 15.

* * * * *